(12) United States Patent
Sondhi et al.

(10) Patent No.: US 12,289,889 B2
(45) Date of Patent: Apr. 29, 2025

(54) THREE-DIMENSIONAL MEMORY DEVICE CONTAINING TEMPLATED CRYSTALLINE FERROELECTRIC MEMORY ELEMENTS AND METHOD OF MAKING THEREOF

(71) Applicant: SANDISK TECHNOLOGIES LLC, Addison, TX (US)

(72) Inventors: Kartik Sondhi, Milpitas, CA (US); Adarsh Rajashekhar, Santa Clara, CA (US); Fei Zhou, San Jose, CA (US); Raghuveer S. Makala, Campbell, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 448 days.

(21) Appl. No.: 17/809,758

(22) Filed: Jun. 29, 2022

(65) Prior Publication Data

US 2024/0008281 A1 Jan. 4, 2024

(51) Int. Cl.
*H10B 51/20* (2023.01)
*H10B 51/30* (2023.01)

(52) U.S. Cl.
CPC ............. *H10B 51/20* (2023.02); *H10B 51/30* (2023.02)

(58) Field of Classification Search
CPC .................................. H10B 51/20; H10B 51/30
See application file for complete search history.

(56) References Cited

U.S. PATENT DOCUMENTS

| 11,049,880 | B2 | 6/2021 | Rajashekhar et al. |
| 11,239,254 | B2 | 2/2022 | Sharangpani et al. |
| 11,309,332 | B2 | 4/2022 | Rajashekhar et al. |
| 2007/0153602 | A1 | 7/2007 | Kang |
| 2007/0153620 | A1 | 7/2007 | Kang |
| 2010/0314679 | A1 | 12/2010 | Lee |
| 2019/0259778 | A1 | 8/2019 | Yoo |
| 2020/0091274 | A1 | 3/2020 | Sharma et al. |
| 2020/0119047 | A1* | 4/2020 | Yoo ...................... H10D 64/033 |

(Continued)

OTHER PUBLICATIONS

Hoffmann, M., et al. "Atomic layer etching of ferroelectric hafnium zirconium oxide thin films enables giant tunneling electroresistance," Appl. Phys. Lett., vol. 120, 122901 (2022); https://doi.org/10.1063/5.0084636.

(Continued)

*Primary Examiner* — Douglas M Menz
(74) *Attorney, Agent, or Firm* — THE MARBURY LAW GROUP PLLC

(57) ABSTRACT

A ferroelectric memory device includes an alternating stack of insulating layers and electrically conductive layers, a memory opening extending vertically through the alternating stack and including laterally-protruding portions at levels of the electrically conductive layers, and a memory opening fill structure located in the memory opening and containing a vertical semiconductor channel and a vertical stack of discrete ferroelectric memory structures located in the laterally-protruding portions of the memory opening. Each of the ferroelectric memory structures includes crystalline ferroelectric material portion and a crystalline template material portion located between a respective electrically conductive layer of the electrically conductive layers and the crystalline ferroelectric material portion.

20 Claims, 40 Drawing Sheets

(56) References Cited

U.S. PATENT DOCUMENTS

| | | |
|---|---|---|
| 2021/0005733 A1 | 1/2021 | Cheng |
| 2021/0036019 A1* | 2/2021 | Sharangpani .......... H10B 51/20 |
| 2021/0082955 A1 | 3/2021 | Rajashekhar et al. |
| 2021/0210491 A1 | 7/2021 | Servalli et al. |
| 2021/0242241 A1 | 8/2021 | Rajashekhar et al. |
| 2021/0265466 A1 | 8/2021 | Mutch et al. |

OTHER PUBLICATIONS

Pacco, A., et al. "Controlled ALE-type recess of molybdenum for future logic and memory applications," *2021 IEEE International Interconnect Technology Conference (IITC)*, 2021, pp. 1-3, doi:10.1109/IITC51362.2021.9537407.

U.S. Appl. No. 17/579,183, filed Jan. 19, 2022, SanDisk Technologies LLC.

* cited by examiner

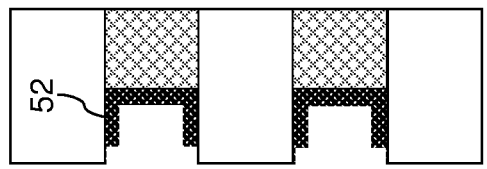
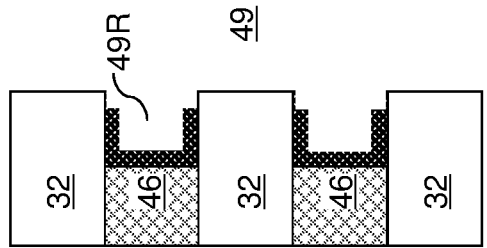
FIG. 6A
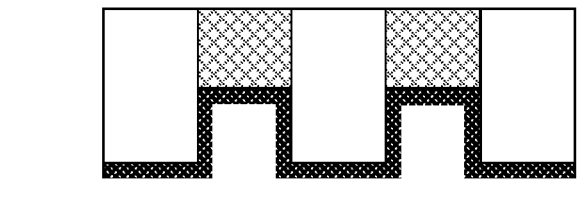
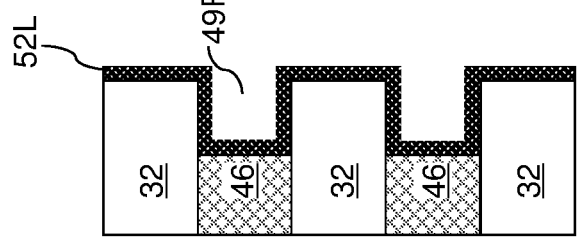
FIG. 6B
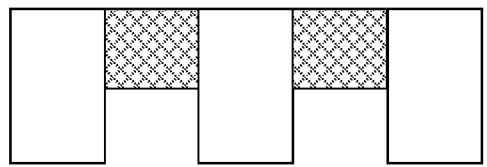
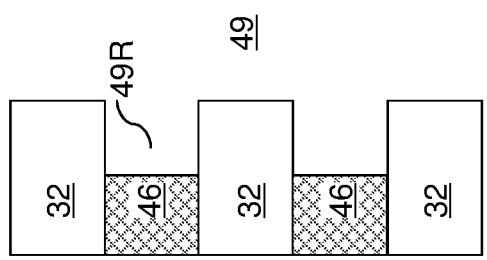
FIG. 6C

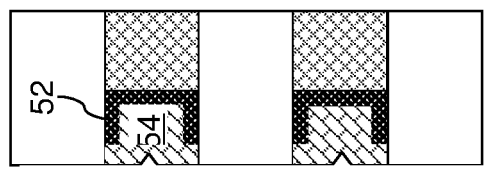
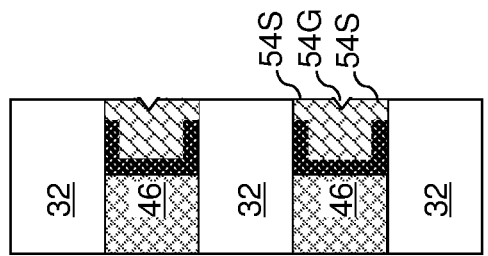
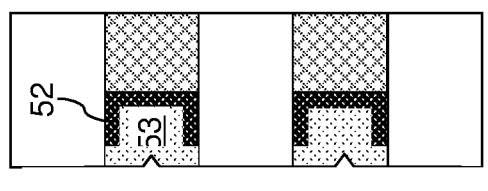
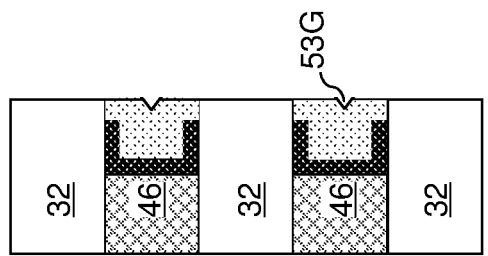
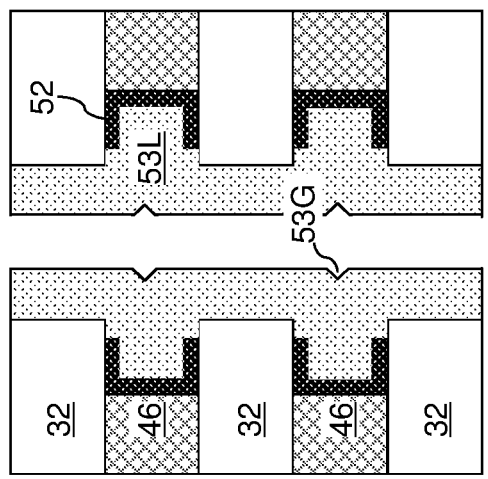
FIG. 6F   FIG. 6E   FIG. 6D

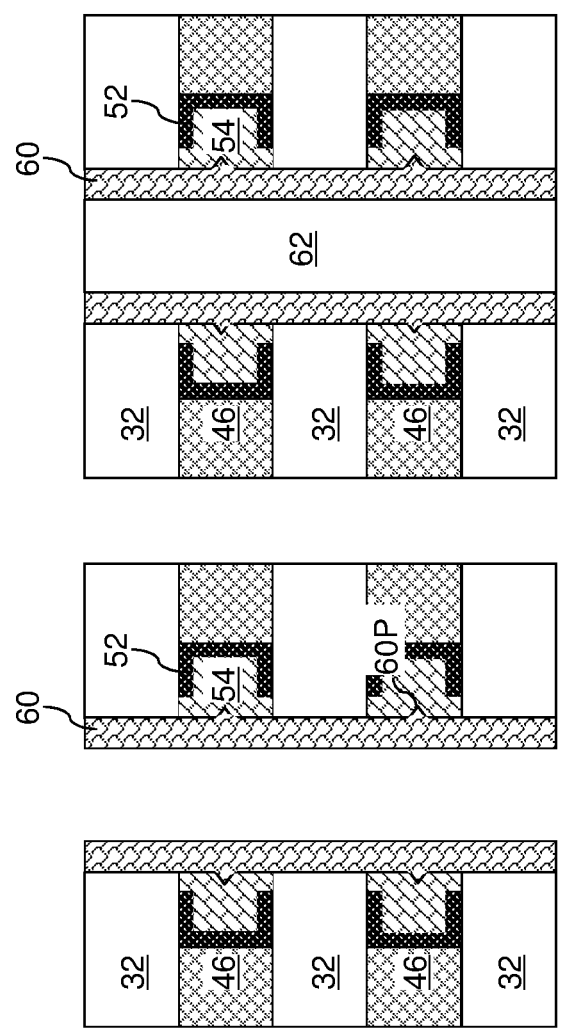

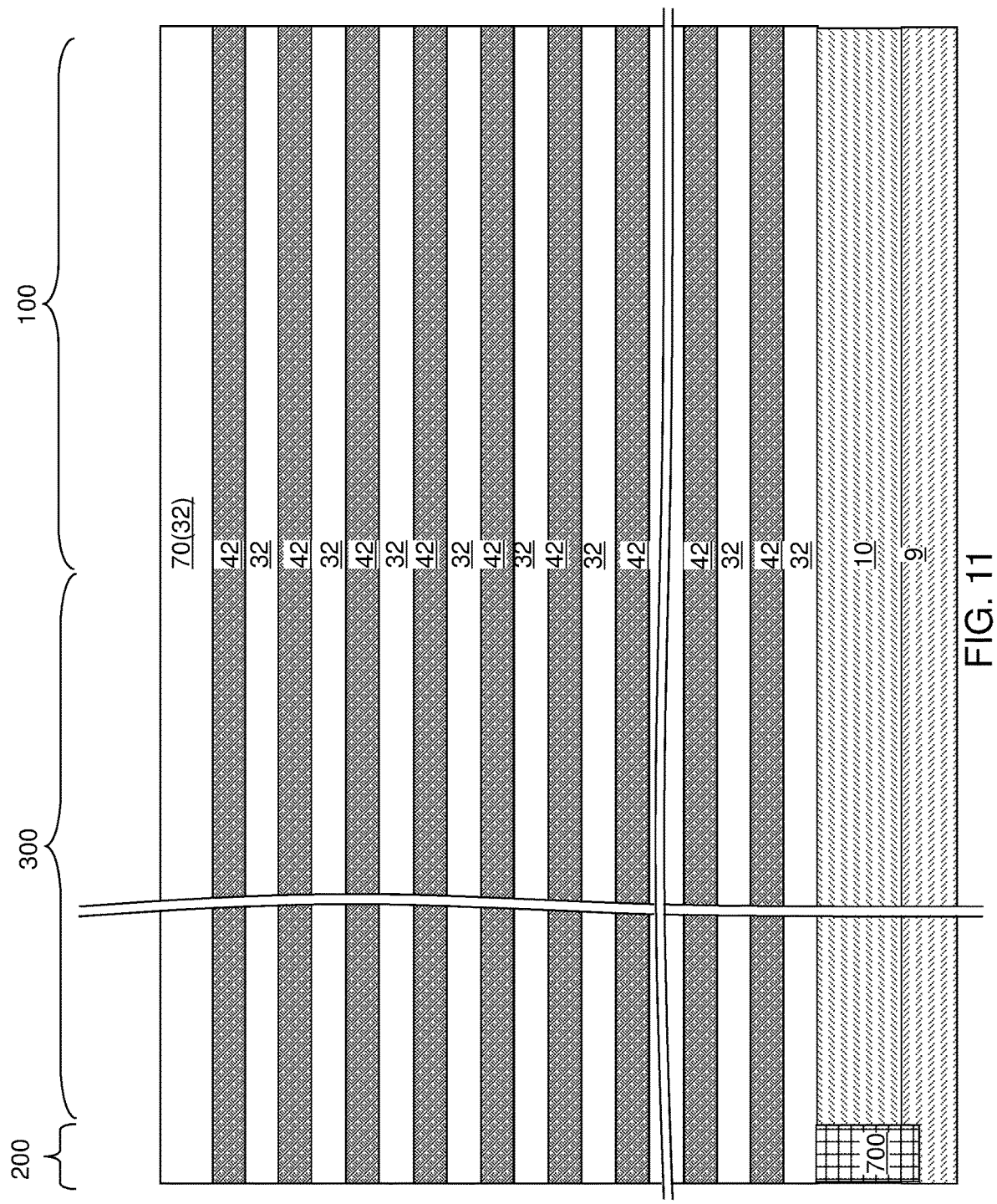

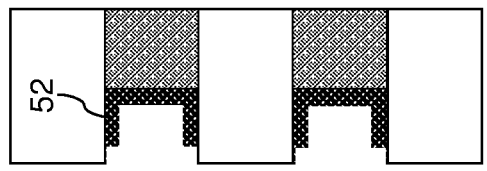
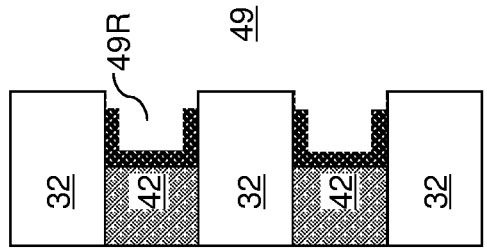
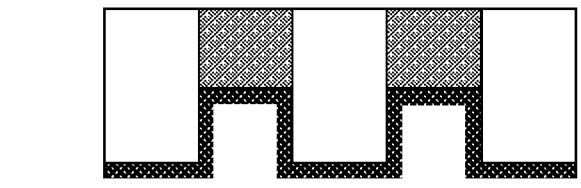
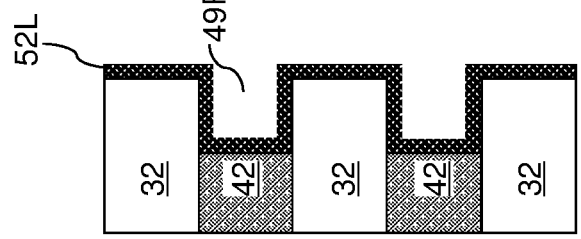
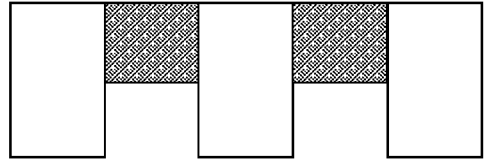
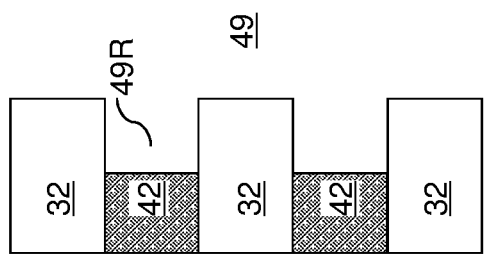
FIG. 15C
FIG. 15B
FIG. 15A

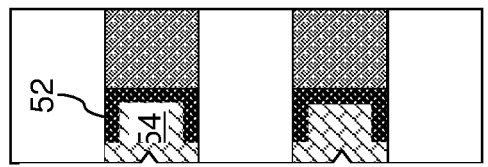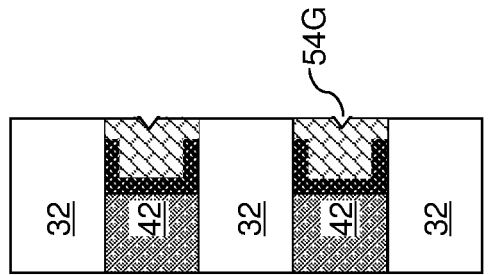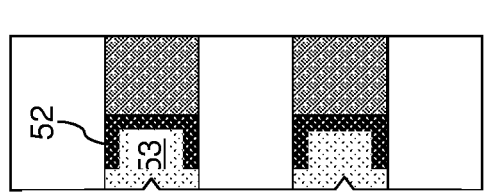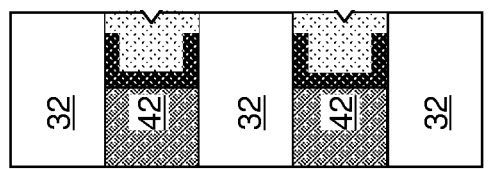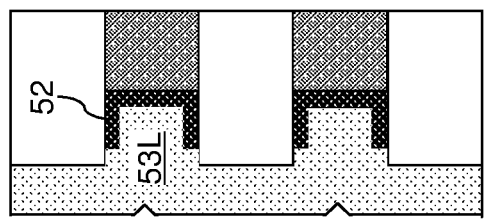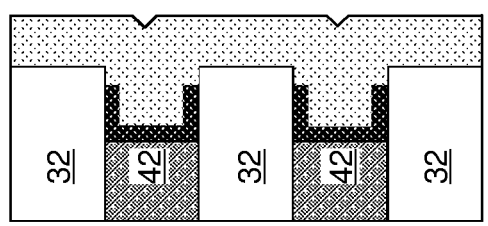

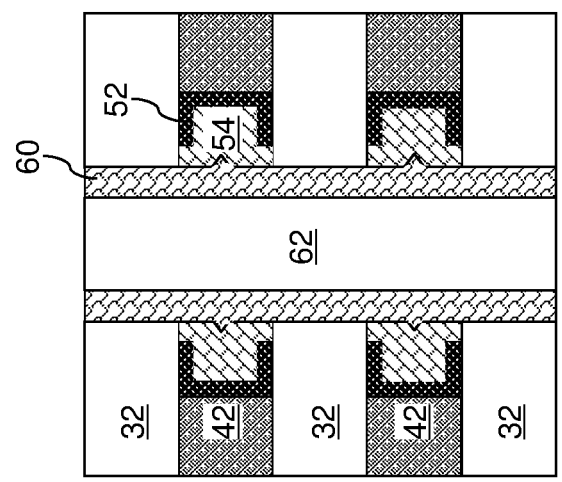
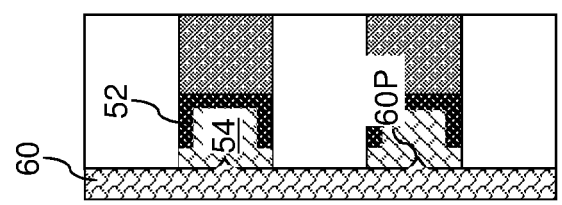
FIG. 15H
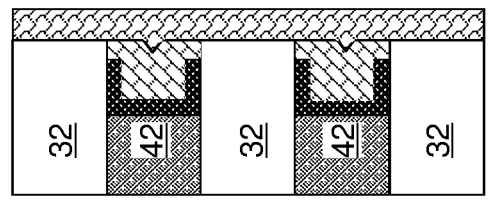
FIG. 15G

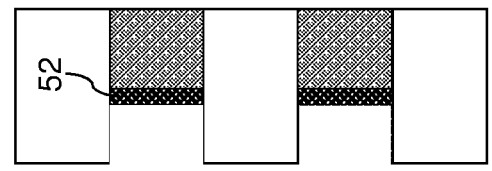
FIG. 16C
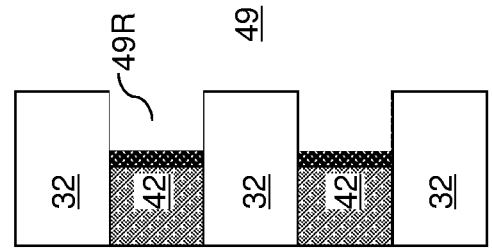
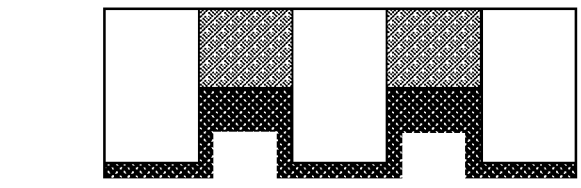
FIG. 16B
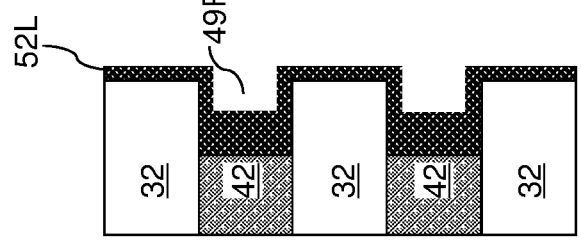
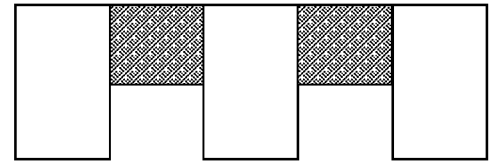
FIG. 16A
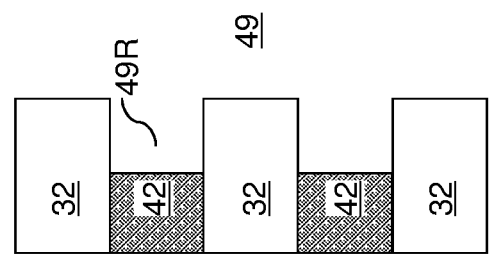

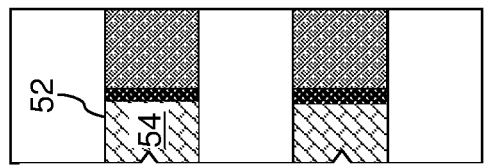
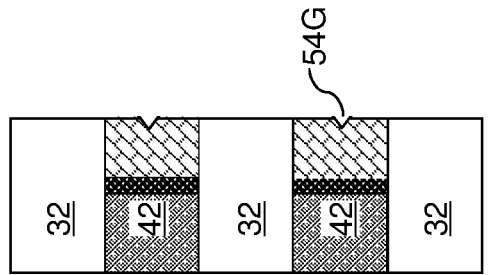
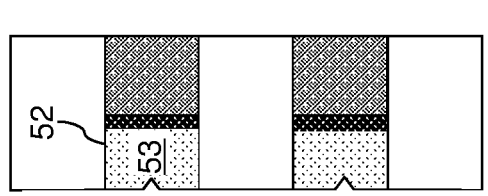
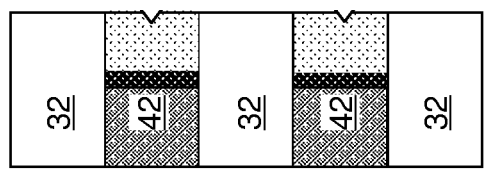
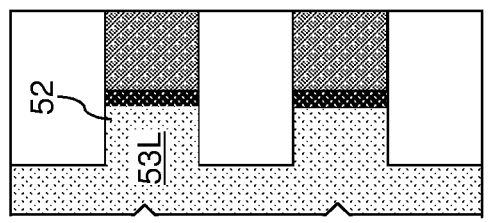
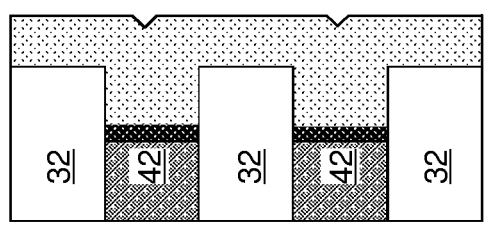
FIG. 16D    FIG. 16E    FIG. 16F

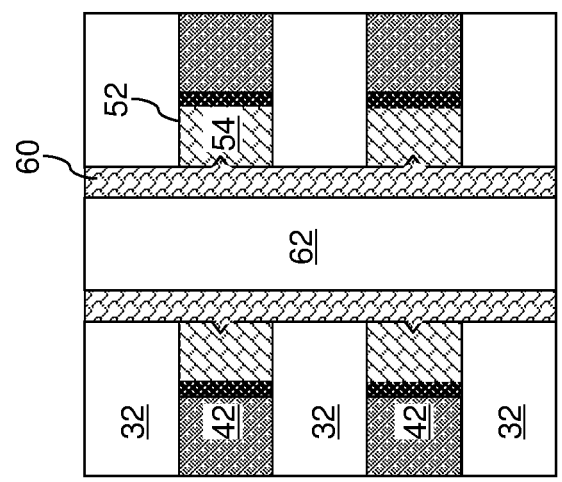
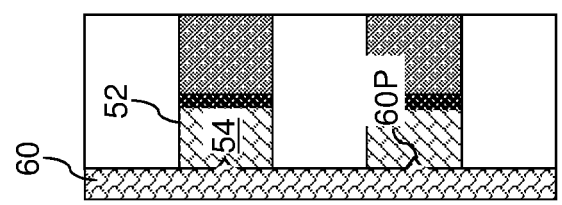
FIG. 16H
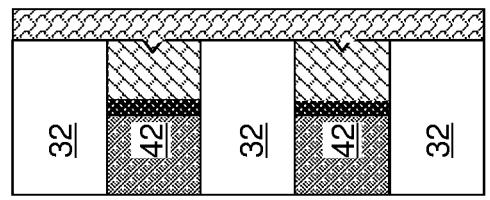
FIG. 16G

THREE-DIMENSIONAL MEMORY DEVICE CONTAINING TEMPLATED CRYSTALLINE FERROELECTRIC MEMORY ELEMENTS AND METHOD OF MAKING THEREOF

FIELD

The present disclosure relates generally to the field of semiconductor devices, and particular to a three-dimensional memory device containing ferroelectric memory elements formed by templated crystallization and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations based on relative atomic positions of constituent atoms, such as oxygen atoms and/or metal atoms, in the crystal lattice depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, a ferroelectric memory device comprises an alternating stack of insulating layers and electrically conductive layers, a memory opening extending vertically through the alternating stack and including laterally-protruding portions at levels of the electrically conductive layers, and a memory opening fill structure located in the memory opening and comprising a vertical semiconductor channel and a vertical stack of discrete ferroelectric memory structures located in the laterally-protruding portions of the memory opening. Each of the ferroelectric memory structures comprises a crystalline ferroelectric material portion and a crystalline template material portion located between a respective electrically conductive layer of the electrically conductive layers and the crystalline ferroelectric material portion.

According to another aspect of the present disclosure, a method of forming a ferroelectric memory device is provided, which comprises: forming an alternating stack of insulating layers and spacer material layers over a substrate, wherein the spacer material layers are formed as electrically conductive layers or are formed as sacrificial material layers that are subsequently replaced with the electrically conductive layers; forming a memory opening vertically extending through the alternating stack; forming lateral recesses at levels of the spacer material layers around the memory opening by isotropically etching the spacer material layers selective to the insulating layers; forming crystalline template material portions within the lateral recesses; forming dielectric material portions in remaining volumes of the lateral recesses; forming a vertical semiconductor channel vertically extending through each layer in the alternating stack within the memory opening; and converting the dielectric material portions into crystalline ferroelectric material portions by performing an anneal process prior to, or after, formation of the vertical semiconductor channel.

BRIEF DESCRIPTION OF THE DRAWINGS

FIGS. 6A-6H are sequential schematic vertical cross-sectional views of a memory opening within the first exemplary structure during formation of ferroelectric memory structures in a first configuration, a vertical semiconductor channel, and a dielectric core according to a first embodiment of the present disclosure.

FIG. 11 is a schematic vertical cross-sectional view of a second exemplary structure after formation of an alternating stack of insulating layers and sacrificial material layers according to the second embodiment of the present disclosure.

FIGS. 15A-15H are sequential schematic vertical cross-sectional views of a memory opening within the second exemplary structure during formation of ferroelectric memory structures in a second configuration, a vertical semiconductor channel, and a dielectric core according to a second embodiment of the present disclosure.

FIGS. 16A-16H are sequential schematic vertical cross-sectional views of a memory opening within the second exemplary structure during formation of ferroelectric memory structures in a third configuration, a vertical semiconductor channel, and a dielectric core according to a second embodiment of the present disclosure.

DETAILED DESCRIPTION

Figure 1:
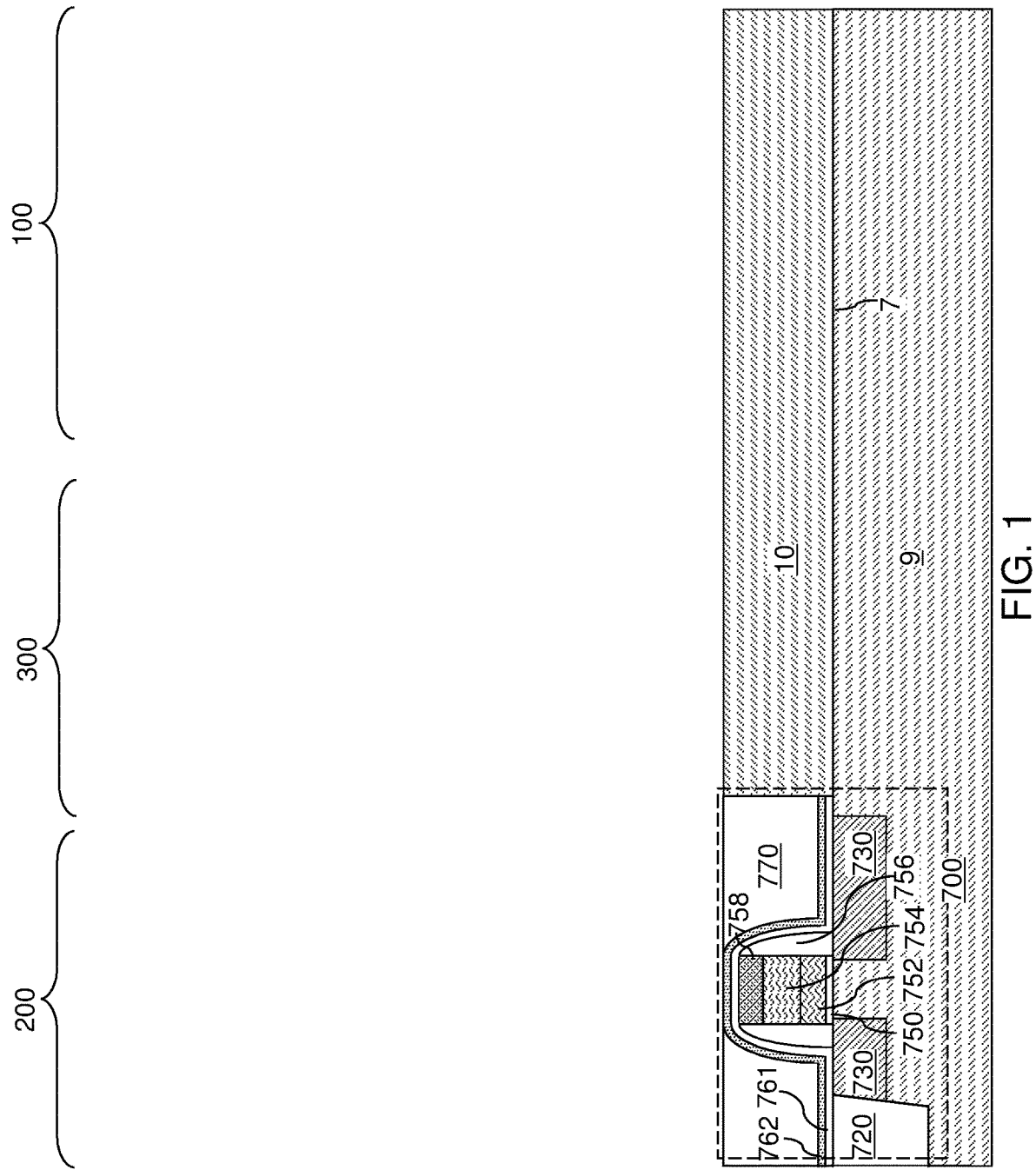
FIG. 1 is a schematic vertical cross-sectional view of a first exemplary structure after formation of at least one peripheral device and a semiconductor material layer according to a first embodiment of the present disclosure.

As discussed above, the present disclosure is directed to a memory device containing ferroelectric memory elements formed by templated crystallization and methods of manufacturing the same, the various aspects of which are described below. The embodiments of the disclosure may be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

The various embodiments of the present disclosure may be employed to form ferroelectric memory devices in which data bits are stored as directions of ferroelectric polarization of ferroelectric memory cells arranged as a vertical stack that surrounds a vertical semiconductor channel. The magnitude of the ferroelectric polarization can in the ferroelectric memory cells may be increased by employing a crystalline template material (such as germanium or strontium titanium oxide) that can increase the crystalline grain size of a ferroelectric material (such as hafnium zirconium oxide) in the ferroelectric memory cells. A highly textured discrete ferroelectric material portions can be provided by a templated crystallization and etch process. Atomic layer etching (ALE) process may be employed to provide precise control of the etch rate for crystalline ferroelectric material during an etch back process that patterns the crystalline ferroelectric material into textured crystalline ferroelectric material portions. A vertical semiconductor channel is surrounded by each vertical stack of crystalline ferroelectric material portions to provide a NAND-type memory string in each memory opening. The crystalline ferroelectric material portions are located between the vertical semiconductor channel on the inner lateral side and the crystalline template material portions and electrically conductive layers on the outer lateral side. The various aspects of embodiments of the present disclosure are now described with reference to accompanying drawings.

Referring to FIG. 1, a first exemplary structure according to the first embodiment of the present disclosure is illustrated, which may be employed, for example, to fabricate a device structure containing vertical NAND memory devices. The first exemplary structure includes a substrate (9, 10), which may be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device can include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 may be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry can contain a driver circuit for memory devices to be subsequently formed, which can include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be employed for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
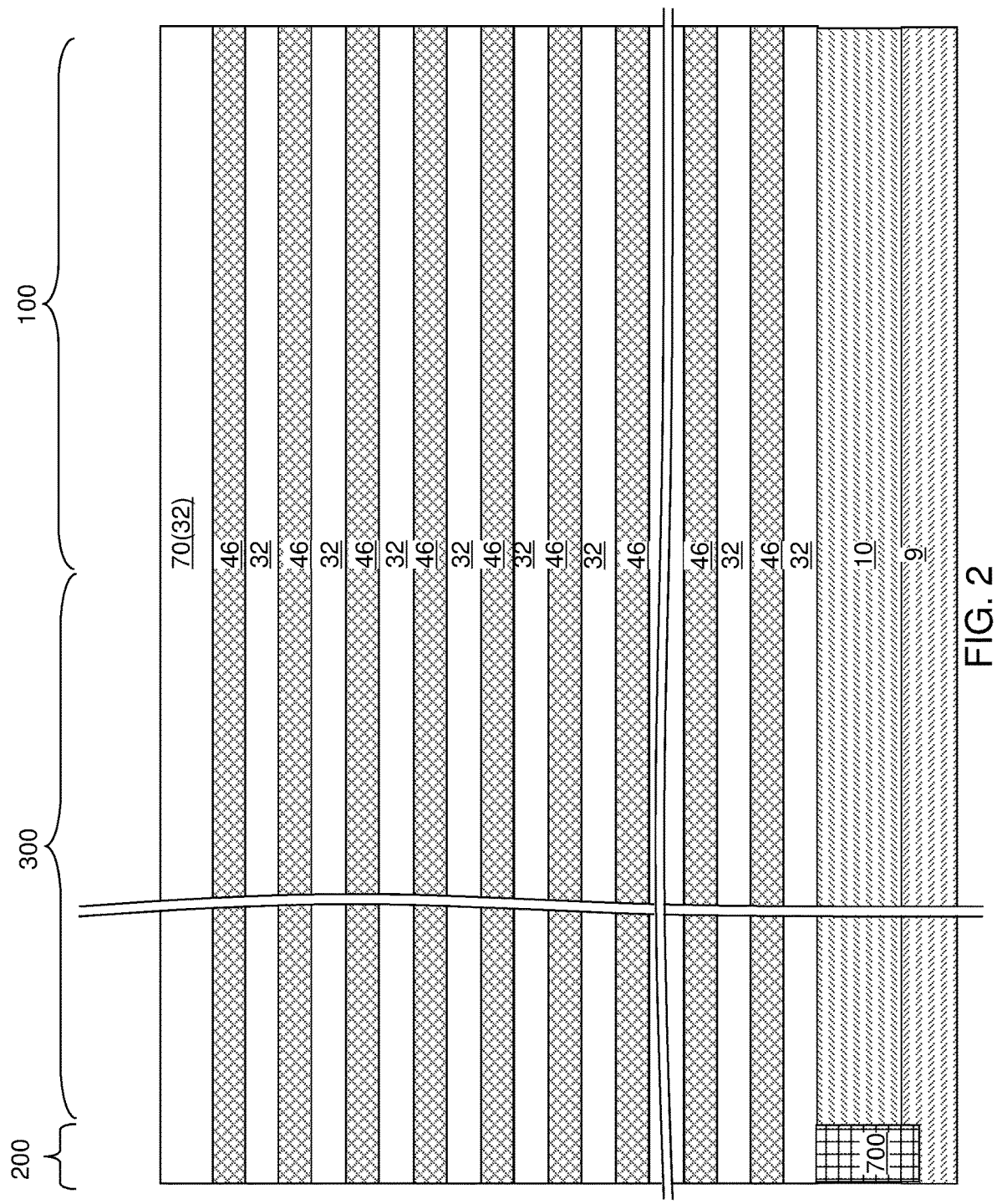
FIG. 2 is a schematic vertical cross-sectional view of the first exemplary structure after formation of an alternating stack of insulating layers and electrically conductive layers according to the first embodiment of the present disclosure.

Referring to FIG. 2, a stack of an alternating plurality of first material layers (which may be insulating layers 32) and second material layers (which may be electrically conductive layers 46) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. As such, each second material layer is a spacer material layer for the first material layers. In one embodiment, each first material layer may be an insulating layer 32, and each second material layer may be an electrically conductive layer 46. In this case, the stack can include an alternating plurality of insulating layers 32 and electrically conductive layers 46, and constitutes a prototype stack of alternating layers comprising insulating layers 32 and electrically conductive layers 46. The topmost layer of the alternating stack (32, 46) may be a topmost insulating layer 70, which is a topmost one among the insulating layers 32.

The stack of the alternating plurality is herein referred to as an alternating stack (32, 46). Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The electrically conductive layers 46 may comprise an electrically conductive material such as a metal or metal alloy material. For example, the electrically conductive layers 46 may comprise and/or may consist essentially of at least one metallic material selected from tungsten, tantalum, titanium, cobalt, ruthenium, molybdenum, niobium, TiN, TaN, WN, and/or MoN. In one embodiment, the second material of the electrically conductive layers 46 may be molybdenum or tungsten.

The thicknesses of the insulating layers 32 and the electrically conductive layers 46 may be in a range from 20 nm to 50 nm, although lesser and greater thicknesses may be employed for each insulating layer 32 and for each electrically conductive layer 46. The number of repetitions of the pairs of an insulating layer 32 and an electrically conductive layer 46 may be in a range from 2 to 1,024, and typically from 8 to 256, although a greater number of repetitions can also be employed. The top and bottom gate electrodes in the stack may function as the select gate electrodes. In one embodiment, each electrically conductive layer 46 in the alternating stack (32, 46) can have a uniform thickness that is substantially invariant within each respective electrically conductive layer 46.

Figure 3A:
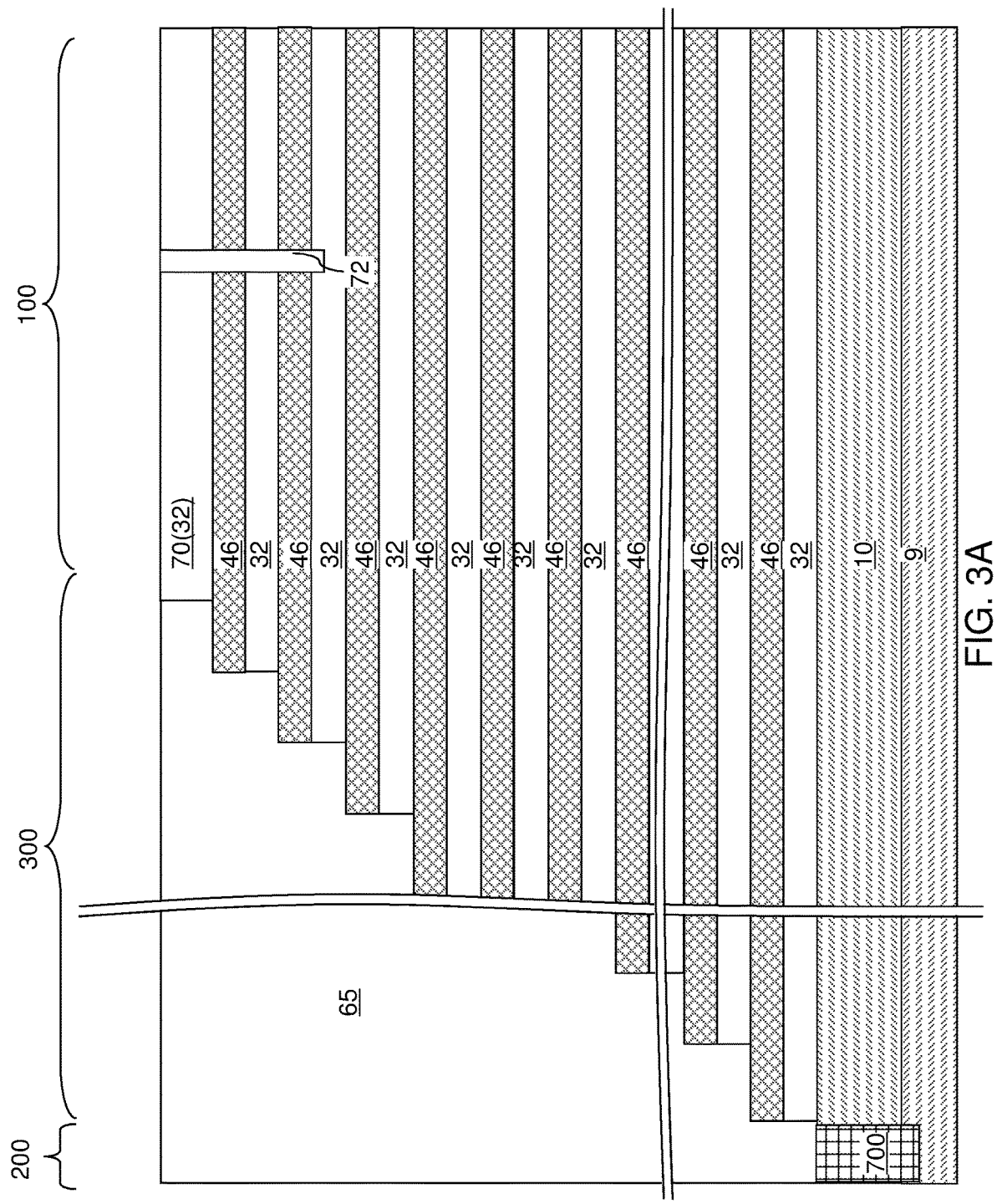
FIG. 3A is a schematic vertical cross-sectional view of the first exemplary structure after formation of stepped terraces and a retro-stepped dielectric material portion according to the first embodiment of the present disclosure.
Figure 3B:
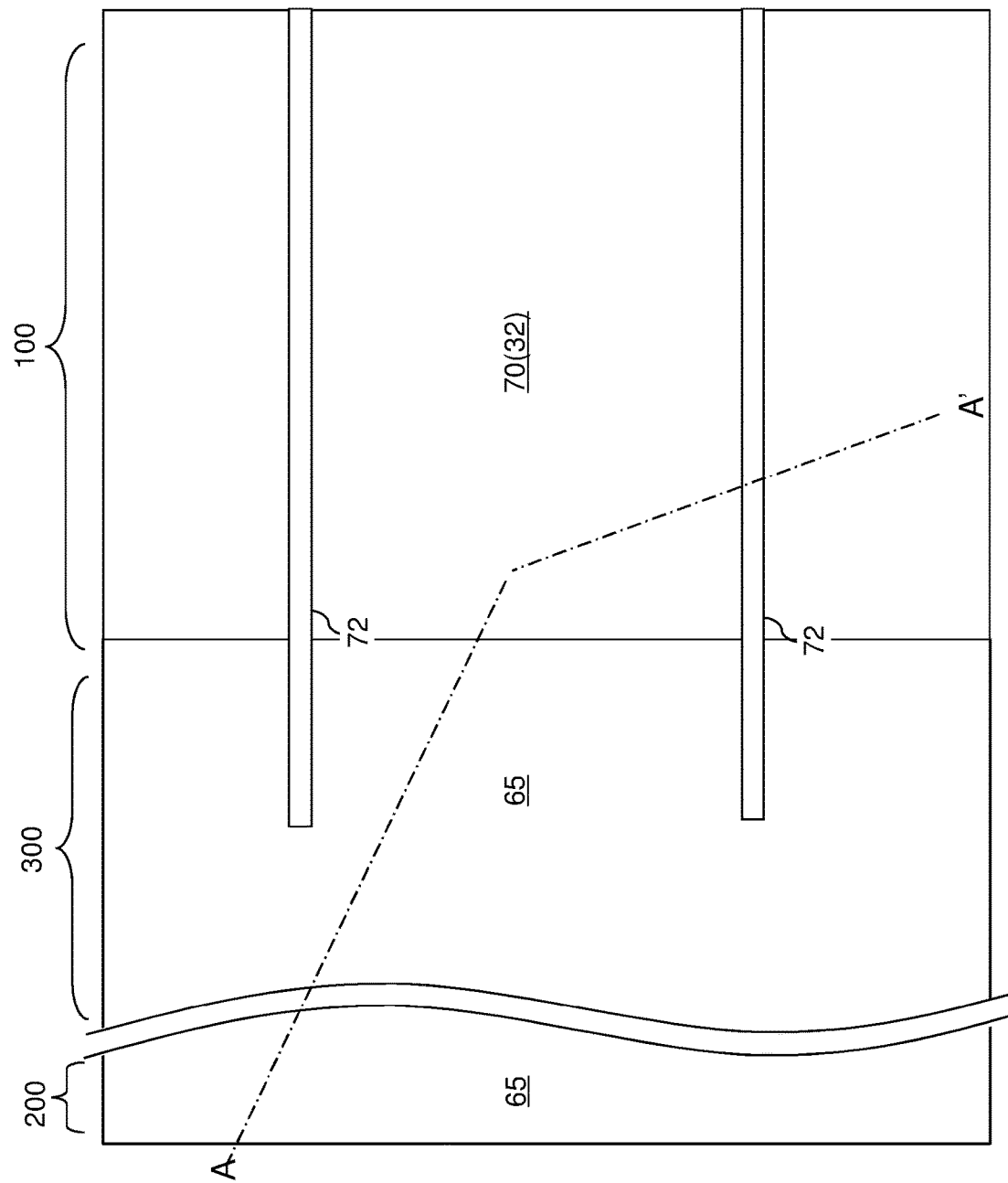
FIG. 3B is a top-down view of the first exemplary structure of FIG. 3A. The vertical plane A-A' is the plane of the cross-section for FIG. 3A.

Referring to FIGS. 3A and 3B, stepped surfaces are optionally formed at a peripheral region of the alternating stack (32, 46), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 46) are removed through formation of the stepped surfaces. A "stepped cavity" refers to a cavity having stepped surfaces. Alternatively, if laterally insulated contact via structures will be formed in contact with the electrically conductive layers 46, the formation of the stepped cavity and the stepped surfaces may be omitted.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each electrically conductive layer 46 other than a topmost electrically conductive layer 46 within the alternating stack (32, 46) laterally extends farther than any overlying electrically conductive layer 46 within the alternating stack (32, 46) in the terrace region. The terrace region includes stepped surfaces of the alternating stack (32, 46) that continuously extend from a bottommost layer within the alternating stack (32, 46) to a topmost layer within the alternating stack (32, 46).

Each vertical step of the stepped surfaces can have the height of one or more pairs of an insulating layer 32 and an electrically conductive layer 46. In one embodiment, each vertical step can have the height of a single pair of an insulating layer 32 and an electrically conductive layer 46. In another embodiment, multiple "columns" of staircases may be formed along a first horizontal direction hd1 such that each vertical step has the height of a plurality of pairs of an insulating layer 32 and an electrically conductive layer 46, and the number of columns may be at least the number of the plurality of pairs. Each column of staircase may be vertically offset from each other such that each of the electrically conductive layers 46 has a physically exposed top surface in a respective column of staircases. In the illustrative example, two columns of staircases are formed for each block of memory stack structures to be subsequently formed such that one column of staircases provide physically exposed top surfaces for odd-numbered electrically conductive layers 46 (as counted from the bottom) and another column of staircases provide physically exposed top surfaces for even-numbered electrically conductive layers (as counted from the bottom). Configurations employing three, four, or more columns of staircases with a respective set of vertical offsets among the physically exposed surfaces of the electrically conductive layers 46 may also be employed. Each electrically conductive layer 46 has a greater lateral extent, at least along one direction, than any overlying electrically conductive layers 46 such that each physically exposed surface of any electrically conductive layer 46 does not have an overhang. In one embodiment, the vertical steps within each column of staircases may be arranged along the first horizontal direction (e.g., word line direction) hd1, and the columns of staircases may be arranged along a second horizontal direction (e.g., bit line direction) hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the topmost insulating layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the topmost insulating layer 70 and a subset of the electrically conductive layers 46 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the topmost insulating layer 70.

Figure 4A:
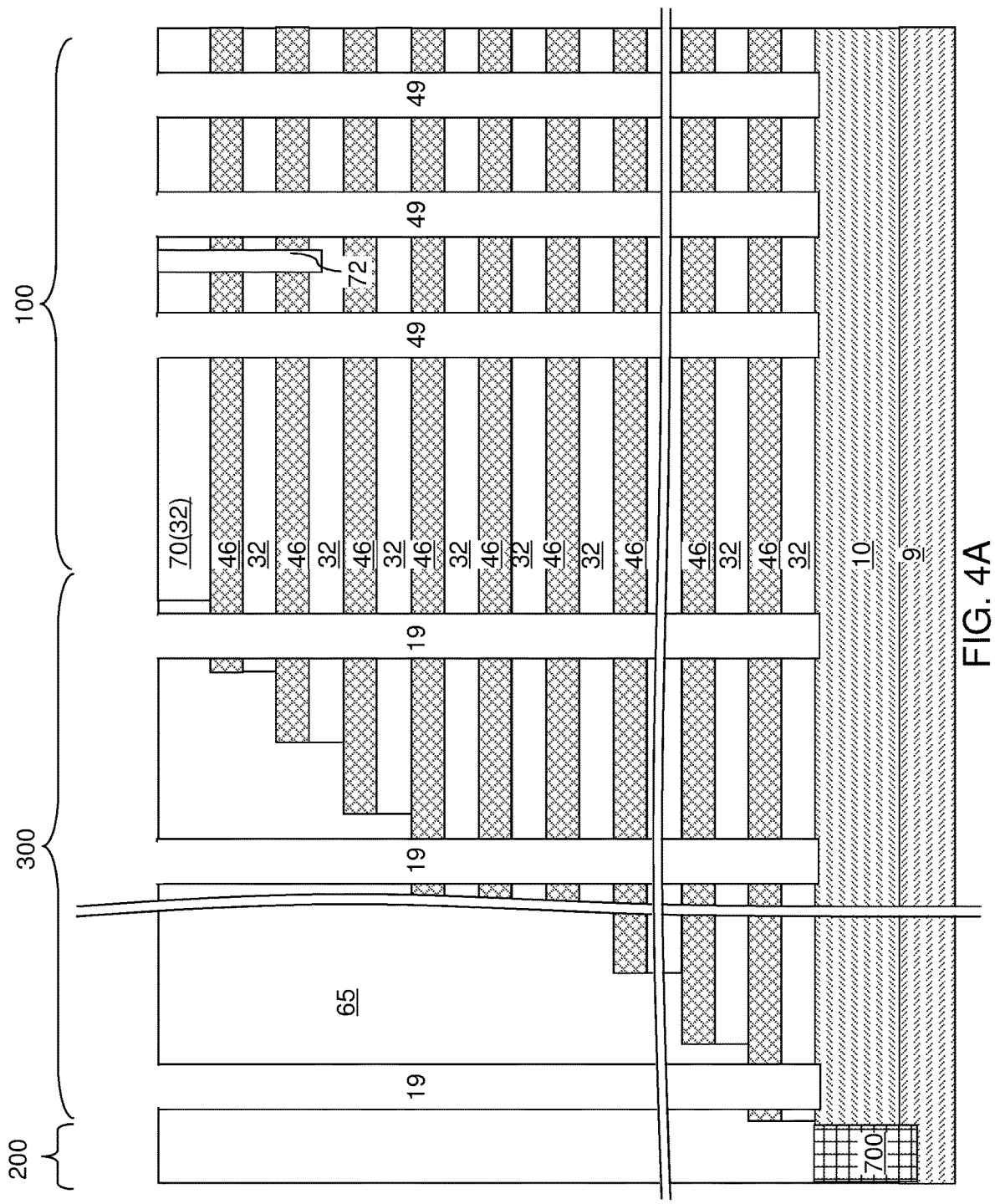
FIG. 4A is a schematic vertical cross-sectional view of the first exemplary structure after formation of memory openings and support openings according to the first embodiment of the present disclosure.
Figure 4B:
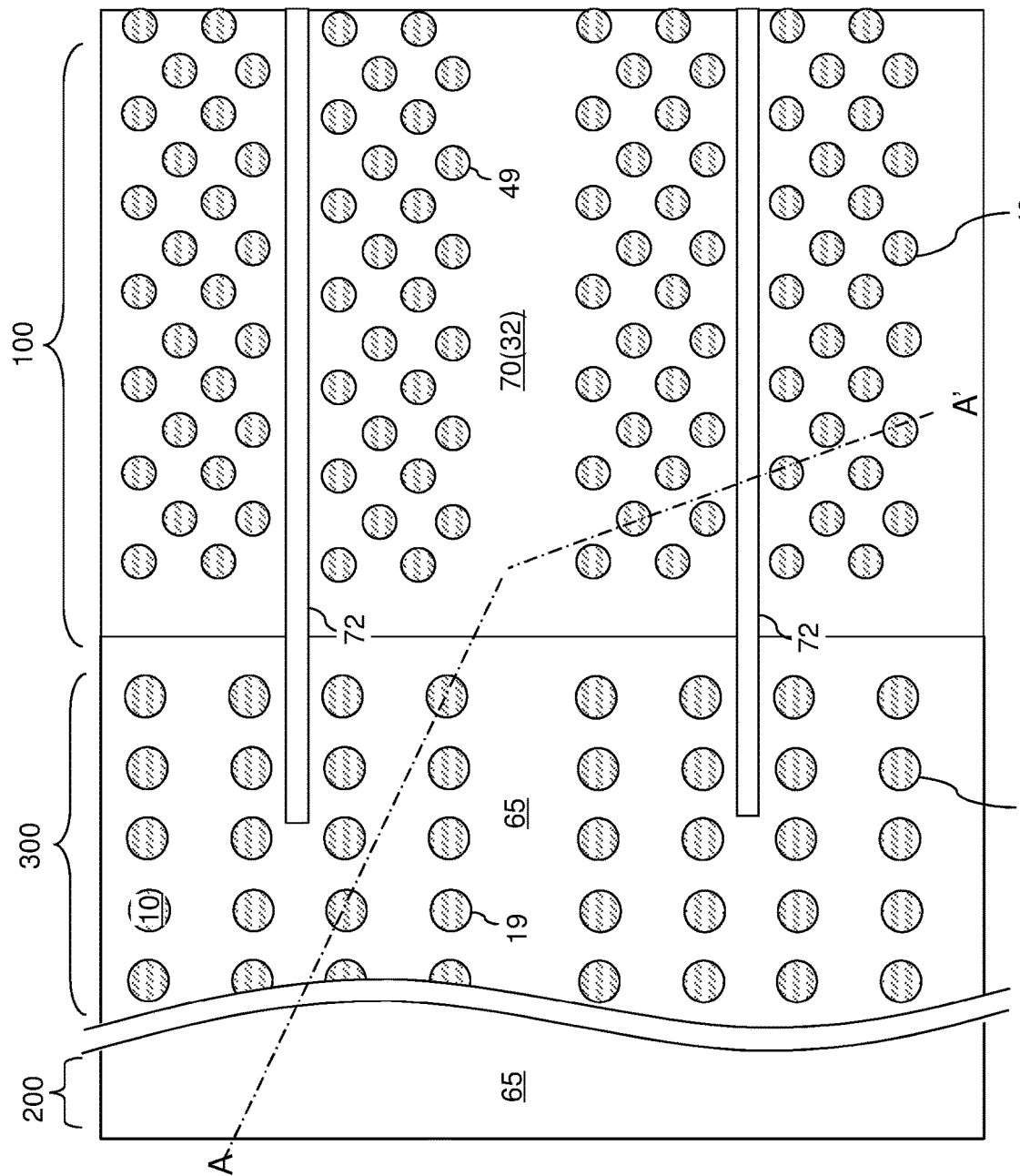
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the topmost insulating layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the topmost insulating layer 70 or the retro-stepped dielectric material portion 65, and through the alternating stack (32, 46) by at least one anisotropic etch that employs the patterned lithographic material stack as an etch mask. Portions of the alternating stack (32, 46) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 70 and the entirety of the alternating stack (32, 46) in the memory array region 100. The support openings 19 are formed through the retro-stepped dielectric material portion and the portion of the alternating stack (32, 46) that underlie the stepped surfaces in the staircase region 300.

The memory openings 49 extend through the entirety of the alternating stack (32, 46). The support openings 19 extend through a subset of layers within the alternating stack (32, 46). The chemistry of the anisotropic etch process employed to etch through the materials of the alternating stack (32, 46) can alternate to optimize etching of the first and second materials in the alternating stack (32, 46). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 can extend from the top surface of the alternating stack (32, 46) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths can also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

Figure 5:
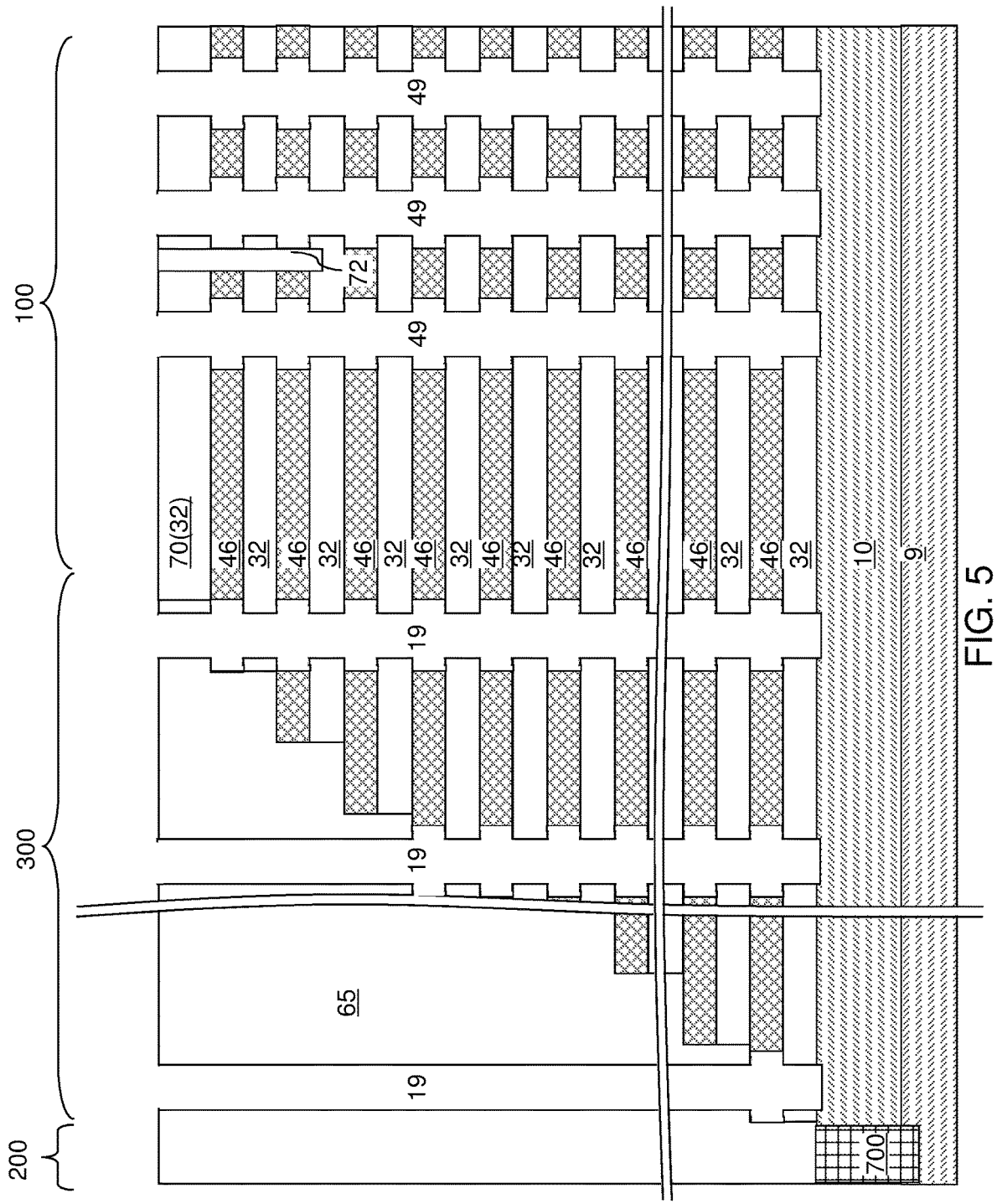
FIG. 5 is a vertical cross-sectional view of the first exemplary structure after laterally recessing sidewalls of the electrically conductive layers around the memory openings and around the support openings according to the first embodiment of the present disclosure.

Referring to FIG. 5, an isotropic etch process can be performed to recess sidewalls of the electrically conductive layers 46 around the memory openings 49 and around the support openings 19. The isotropic etch process has an etch chemistry that etches the material of the electrically conductive layers 46 selective to the material of the insulating layers 32. For example, the isotropic etch process may comprise a wet etch process that etches metal selective to the dielectric material of the insulating layers 32 (such as silicon oxide). For example, atomic layer etching may be used if the electrically conductive layers 46 comprise molybdenum. Lateral recesses are formed at levels of the electrically conductive layers 46 around the memory opening 49 by isotropically etching the electrically conductive layers 46 selective to the insulating layers 32. The lateral recess distance of the isotropic etch process, as measured between a vertical plane including sidewalls of the insulating layers 32 and a vertical plane including recessed sidewalls of the electrically conductive layers 46, around each memory opening 49 may be in a range from 10 nm to 100 nm, such as from 20 nm to 50 nm, although lesser and greater lateral recess distances may also be employed.

FIGS. 6A-6H are sequential schematic vertical cross-sectional views of a memory opening 49 within the first exemplary structure during formation of ferroelectric memory structures (52, 54) in a first configuration, a vertical semiconductor channel 60, and an optional dielectric core 62 according to the first embodiment of the present disclosure.

Referring to FIG. 6A, a region of a memory opening 49 is illustrated after formation of a vertical stack of annular lateral recesses 49R. The annular lateral recesses may be formed at each level of the electrically conductive layers 46.

Referring to FIG. 6B, a continuous crystalline template material layer 52L can be deposited on sidewalls of the insulating layers 32, on physically exposed annular horizontal surfaces of the insulating layers 32, and on recessed sidewalls of the electrically conductive layers 46 around the lateral recesses 49R around in each of the memory openings 49 and the support openings. In one embodiment, the continuous crystalline template material layer 52L may be formed as a conformal material layer having a uniform thickness throughout. For example, the continuous crystalline template material layer 52L may formed by a chemical vapor deposition process or an atomic layer deposition process. The continuous crystalline template material layer 52L may be deposited as a polycrystalline material layer.

According to an aspect of the present disclosure, the continuous crystalline template material layer 52L includes a material that can function as a crystalline template for a ferroelectric material to be subsequently formed thereupon. For example, the continuous crystalline template material layer 52L may comprise and/or may consist essentially of a material selected from germanium or strontium titanium oxide (e.g., strontium titanate, "STO"). In this case, polycrystalline germanium or polycrystalline strontium titanium oxide may function as a crystallization template for hafnium zirconium oxide which can be a ferroelectric material in an orthorhombic phase. Generally, any crystalline template material that can facilitate crystallization of a ferroelectric material may be employed as the material for the continuous crystalline template material layer 52L. The thickness of the continuous crystalline template material layer 52L may be in a range from 2 nm to 20 nm, such as from 3 nm to 15 nm, although lesser and greater thicknesses may also be employed.

Referring to FIG. 6C, an anisotropic etch process can be performed to remove portions of the continuous crystalline template material layer 52L that are located outside the volumes of the lateral recesses 49R in the memory openings 49 and in the support openings 19. Each portion of the continuous crystalline template material layer 52L that is not covered by a respective overlying insulating layer 32 can be removed by the anisotropic etch process. The anisotropic etch process may comprise a reactive ion etch process that etches portions of the continuous crystalline template material layer 52L that are located above the topmost insulating layer 70 or within cylindrical volumes defined by cylindrical vertical planes including sidewalls of the memory openings 49 or the support openings 19. At least the terminal portion of the reactive ion etch process may have a collateral isotropic etch component so that portions of the continuous crystalline template material layer 52L are removed which are proximal to cylindrical volumes of the memory openings 49 or the support openings 19 as defined by the cylindrical vertical planes.

Generally, the anisotropic etch process etches back vertically-extending portions of the continuous crystalline template material layer 52L that are located within the cylindrical volumes defined by the cylindrical vertical planes including sidewalls of the insulating layers 32 around each memory opening 49 and around each support opening 19. Remaining portions of the continuous crystalline template material layer 52L comprises the crystalline template material portions 52. Each of the crystalline template material portions 52 can be formed within a respective one of the lateral recesses 49R around a respective memory opening 49 or around a respective support opening 19. According to an aspect of the present disclosure, portions of the crystalline template material that are proximal to the cylindrical vertical planes are collaterally etched so that the template material portions 52 are recessed from the inner edges of the lateral recesses 49R. For example, the template material portions 52 are recessed by 4 to 5 nm from the inner edges of the lateral recesses 49R. In this embodiment, each of the insulating layers 32 comprises at least one annular horizontal surface (e.g., a 4 to 5 nm long surface) that is physically exposed to a respective one of the lateral recesses 49R after formation of the crystalline template material portions 52. Generally, the lateral distance between the inner periphery and the outer periphery of each physically exposed annular horizontal surface of the insulating layers 32 may 10 nm or less, such as from 4 nm to 5 nm, although lesser and greater lateral distances may also be employed.

In one embodiment, each of the crystalline template material portions 52 may have a clam-shaped vertical cross-sectional profile. In this case, each of the crystalline template material portions 52 may comprise a respective upper annular horizontal portion contacting a bottom surface of a respective overlying insulating layer 32 within the alternating stack (32, 46), a respective lower annular horizontal portion contacting a top surface of a respective underlying insulating layer 32 within the alternating stack (32, 46), and a respective tubular vertically-extending portion adjoined to an outer periphery of the respective upper annular horizontal portion and adjoined to an outer periphery of the respective lower annular horizontal portion and contacting a sidewall of a respective one of the electrically conductive layers 46. Each of the crystalline template material portions 52 around a memory opening 49 may be laterally spaced from a respective cylindrical vertical plane including sidewalls of the insulating layers 32 exposed in the memory opening 49.

Referring to FIG. 6D, dielectric material layer 53L can be conformally deposited in remaining volumes of the lateral recesses 49R and at peripheral regions of the memory openings 49 and the support openings 19. The dielectric material layer 53L includes material that may be crystallized into a ferroelectric dielectric material after an anneal. In one embodiment, the dielectric material layer 53L is an amorphous dielectric material layer 53L. According to an aspect of the present disclosure, the ferroelectric dielectric material may be substantially lattice-matched with the crystalline material in the crystalline template material portions 52. In one embodiment, the crystalline template material portions 52 may comprise, and/or may consist essentially of, germanium or strontium titanium oxide, and the amorphous dielectric material layer 53L may comprise and/or may consist essentially of hafnium zirconium oxide. In one embodiment, the hafnium zirconium oxide may have a formula $Hf_{1-x}Zr_xO_{2-y}$, where $0.3 \leq x \leq 0.7$ and $0 \leq y \leq 0.3$. The amorphous dielectric material layer 53L may be deposited by atomic layer deposition.

The thickness of the amorphous dielectric material layer 53L may be selected to be about one half of the thickness of each electrically conductive layer 46. In this case, the amorphous dielectric material layer 53L may have a physically exposed surface within each of the memory openings 49 that has a vertical stack of annular horizontal grooves 53G. Each of the annular horizontal grooves 53G may be located at a level of a respective one of the electrically conductive layers 46 midway between a horizontal plane including the top surface of the one of the electrically conductive layers 46 and a horizontal plane including the bottom surface of the one of the electrically conductive layers 46.

Referring to FIG. 6E, an etch process can be performed to remove vertically-extending portions of the amorphous dielectric material layer 53L that are located outside the volumes of the lateral recesses. In one embodiment, the etch process may comprise an atomic layer etch (ALE) process that etches the material of the amorphous dielectric material layer 53L one layer at a time. Remaining portions of the amorphous dielectric material layer 53L located in a respective one of the lateral recesses 49R constitutes an amorphous dielectric material portion 53. A vertical stack of amorphous dielectric material portions 53 can be formed in a vertical stack of lateral recesses 49R within each memory opening 49. The amorphous dielectric material portions 53 may be formed in remaining volumes of the lateral recesses 49R that remain after formation of the crystalline template material portions 52.

Referring to FIG. 6F, an anneal process may be performed to convert the amorphous dielectric material portions 53 into crystalline ferroelectric material portions 54. The elevated temperature of the anneal process may be in a range from 600 degrees Celsius to 1,000 degrees Celsius, and the duration of the anneal process may be in a range from 1 second to 120 minutes. Generally, the higher the anneal temperature, the shorter the duration of the anneal process. Each contiguous combination of a crystalline ferroelectric material portion 54 and a crystalline template material portion 52 constitutes a ferroelectric memory structure (52, 54). A vertical stack of ferroelectric memory structures (52, 54) can be formed in the laterally-protruding portions of each memory opening 49.

Each of the ferroelectric memory structures (52, 54) comprises a crystalline ferroelectric material portion 54 having a physically exposed surface and located in contact with a respective overlying insulating layer 32 and in contact with a respective underlying insulating layer 32, and a crystalline template material portion 52 contacting the crystalline ferroelectric material portion 54 and located in contact with the respective overlying insulating layer 32 and in contact with the respective underlying insulating layer 32.

Without wishing to be bound by a particular theory, the crystalline template material portion 52 may facilitate the crystallization of the dielectric material portions 53 into the textured crystalline ferroelectric material portions 54 having a large crystal grain size by at least one of epitaxial alignment and/or imposition of stress. For example, the crystalline template material portions 52 may function as a crystalline seed layer which induces epitaxial alignment with crystalline ferroelectric material portions 54 during the crystallization anneal, which leads to a larger grain size after the crystallization anneal. Alternatively or in addition, the crystalline template material portions 52 may induce a stress on the crystalline ferroelectric material portions 54 during the crystallization anneal, which leads to a larger grain size after the crystallization anneal.

In one embodiment, each of the crystalline template material portions 52 comprises a respective upper annular horizontal portion contacting a bottom surface of a respective overlying insulating layer 32 within the alternating stack (32, 46), a respective lower annular horizontal portion contacting a top surface of a respective underlying insulating layer 32 within the alternating stack (32, 46), and a respective tubular vertically-extending portion adjoined to an outer periphery of the respective upper annular horizontal portion and adjoined to an outer periphery of the respective lower annular horizontal portion.

In one embodiment, each of the crystalline ferroelectric material portions 54 comprises at least one inner sidewall segment that is vertically coincident with a sidewall of a respective overlying insulating layer 32 of the insulating layers 32. In one embodiment, each of the crystalline ferroelectric material portions 54 comprises a respective annular horizontally-extending groove 54G that extends outward from the vertical semiconductor channel 60 toward the electrically conductive layers 46. In one embodiment, each of the crystalline ferroelectric material portion 54 comprises two cylindrical inner sidewall segments 54S and an annular horizontally-extending groove 54G that is located between and is adjoined to the two cylindrical inner sidewall segments.

In one embodiment, the crystalline template material portions 52 comprise and/or consist essentially of a material selected from germanium or strontium titanium oxide (e.g., strontium titanate). In one embodiment, the crystalline ferroelectric material portions 54 comprise and/or consist essentially of hafnium zirconium oxide.

In an alternative embodiment, the anneal process may be postponed to a subsequent processing step. For example, the anneal process may be performed after formation of a vertical semiconductor channel 60 within each memory opening 49.

Referring to FIG. 6G, a semiconductor material can be deposited in each memory opening 49 and in each support opening. The semiconductor material may comprise at least one elemental semiconductor material such as silicon, germanium, or a silicon-germanium alloy. Alternatively or additionally, the semiconductor material may comprise a compound semiconductor material such as a III-V compound semiconductor material or a II-VI compound semiconductor material. In one embodiment, the semiconductor material may be formed at a peripheral region of each memory opening 49 and each support opening 19 without filling a center region. Alternatively, the semiconductor material may fill an entirety of each unfilled volume of the memory openings 49 and the support openings 19. The semiconductor material may be undoped (i.e., does not have any intentionally introduced dopants), and/or may have a doping of the first conductivity type which is the same as the conductivity type of the semiconductor material layer 10.

Each portion of the deposited semiconductor material that is located within a respective memory opening 49 or a respective support opening 19 constitutes a vertical semiconductor channel 60. In one embodiment, a vertical semiconductor channel 60 may comprise a vertical stack of ring-shaped protrusions 60P contacting a respective one of the annular horizontally-extending grooves 54G of the crystalline ferroelectric material portions 54. Generally, each vertical semiconductor channel 60 within the memory openings 49 vertically extends through each layer in the alternating stack (32, 46).

In one embodiment, each of the crystalline ferroelectric material portions 54 comprises a respective annular horizontally-extending groove 54G that extends outward from the vertical semiconductor channel 60 toward the electrically conductive layers 46, and each of the crystalline ferroelectric material portions 54 comprises at least one inner sidewall segment 54S that is vertically coincident with a sidewall of a respective overlying insulating layer 32 of the insulating layers 32. In one embodiment, each of the crystalline template material portions 52 is laterally spaced from the vertical semiconductor channel 60 by a respective one of the crystalline ferroelectric material portions 54.

Referring to FIG. 6H, in case any unfilled cavity is present within the memory openings 49 and/or within the support openings 19, a dielectric fill material such as silicon oxide can be deposited in the unfilled cavities. The dielectric fill material can be vertically recessed such that the top surface of each remaining portion of the dielectric fill material is formed at, or about, the horizontal plane including the bottom surface of the topmost insulating layer 70. Each remaining portion of the dielectric fill material constitutes a dielectric core 62.

Alternatively, in case an unfilled cavity is not present and the vertical semiconductor channels 60 fill core portions of the memory openings 49 and the support openings 19, deposition of the dielectric fill material is not necessary.

Figure 7:
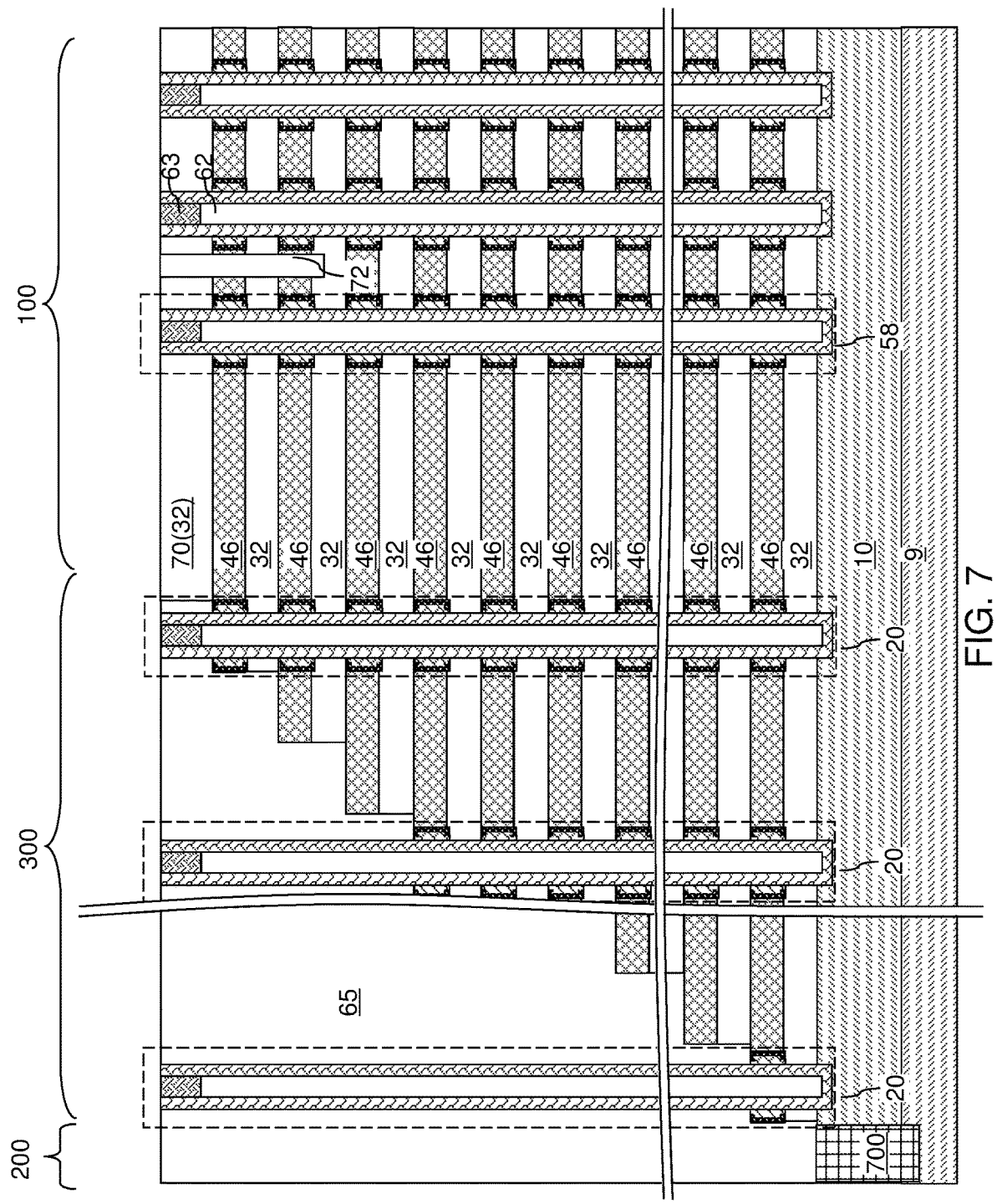
FIG. 7 is a schematic vertical cross-sectional view of the first exemplary structure after formation of memory stack structures and support pillar structures according to the first embodiment of the present disclosure.

Referring to FIG. 7, recesses overlying the top surfaces of the dielectric cores 62 can be filled with a doped semiconductor material having a doping of a second conductivity type that is the opposite of the first conductivity type. Excess portions of the deposited doped semiconductor material and any remaining horizontally-extending portion of the semiconductor material layer (of which vertically-extending portions comprise the vertical semiconductor channels 60) can be removed from above the horizontal plane including the top surface of the topmost insulating layer 70 by a planarization process. The planarization process may comprise a chemical mechanical polishing (CMP) process and/or a recess etch process. Each remaining portion of the doped semiconductor material having a doping of the second conductivity type constitutes a drain region 63. The atomic concentration of dopants of the second conductivity in the drain regions 63 may be in a range from $5.0 \times 10^{18}/cm^3$ to $2.0 \times 10^{21}/cm^3$, although lesser and greater thicknesses can also be employed.

The set of all material portions that fills a memory opening 49 constitutes a memory opening fill structure 58. The set of all material portions that fills a support opening 19 constitutes a support pillar structure 20. An instance of a memory opening fill structure 58 may be formed within each memory opening 49 of the structure of FIG. 5. An instance of the support pillar structure 20 may be formed within each support opening 19 of the structure of FIG. 5. Each vertical semiconductor channel 60 may contact a recessed surface of the semiconductor material layer 10.

Figure 8A:
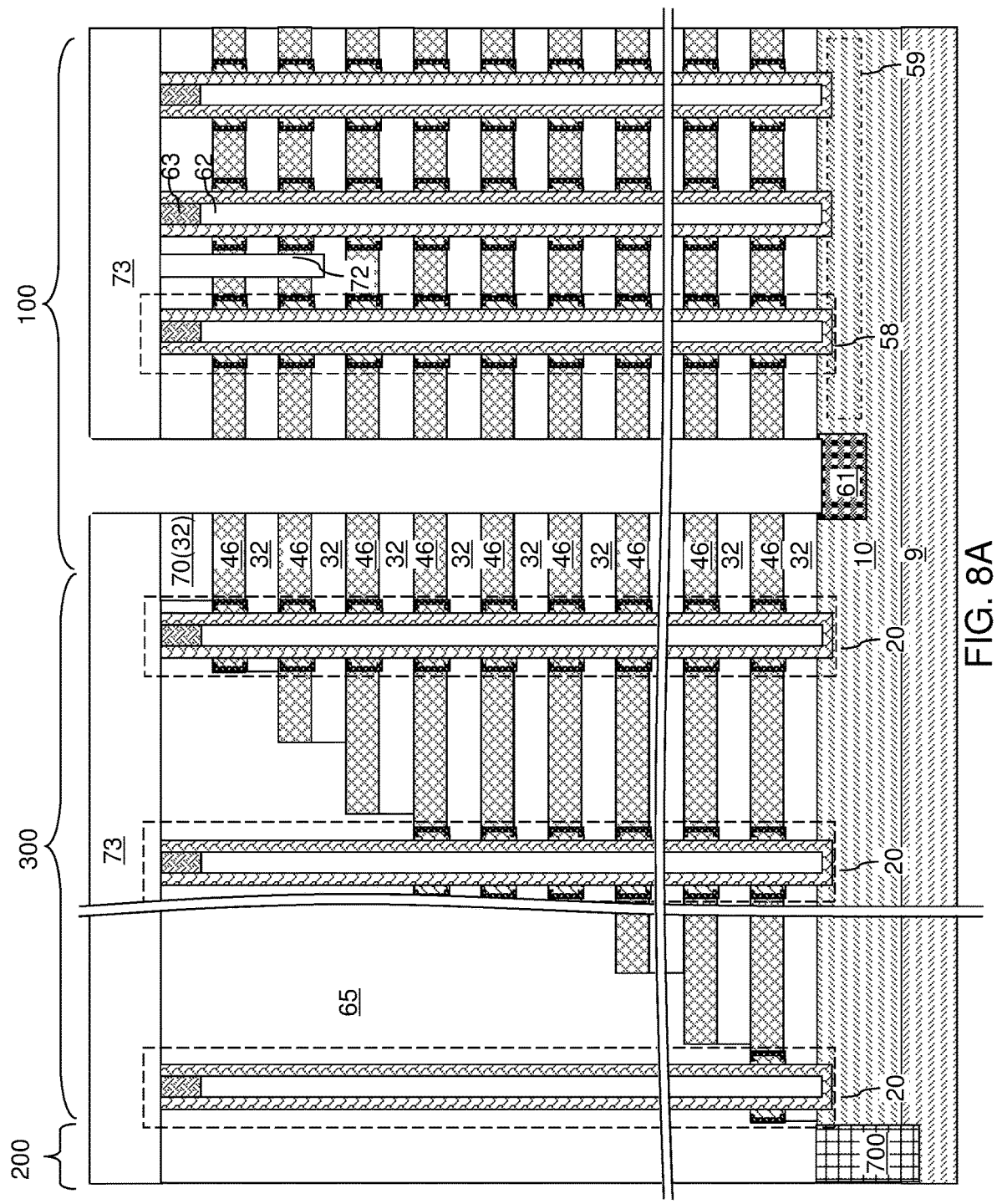
FIG. 8A is a schematic vertical cross-sectional view of the first exemplary structure after formation of backside trenches according to the first embodiment of the present disclosure.
Figure 8B:
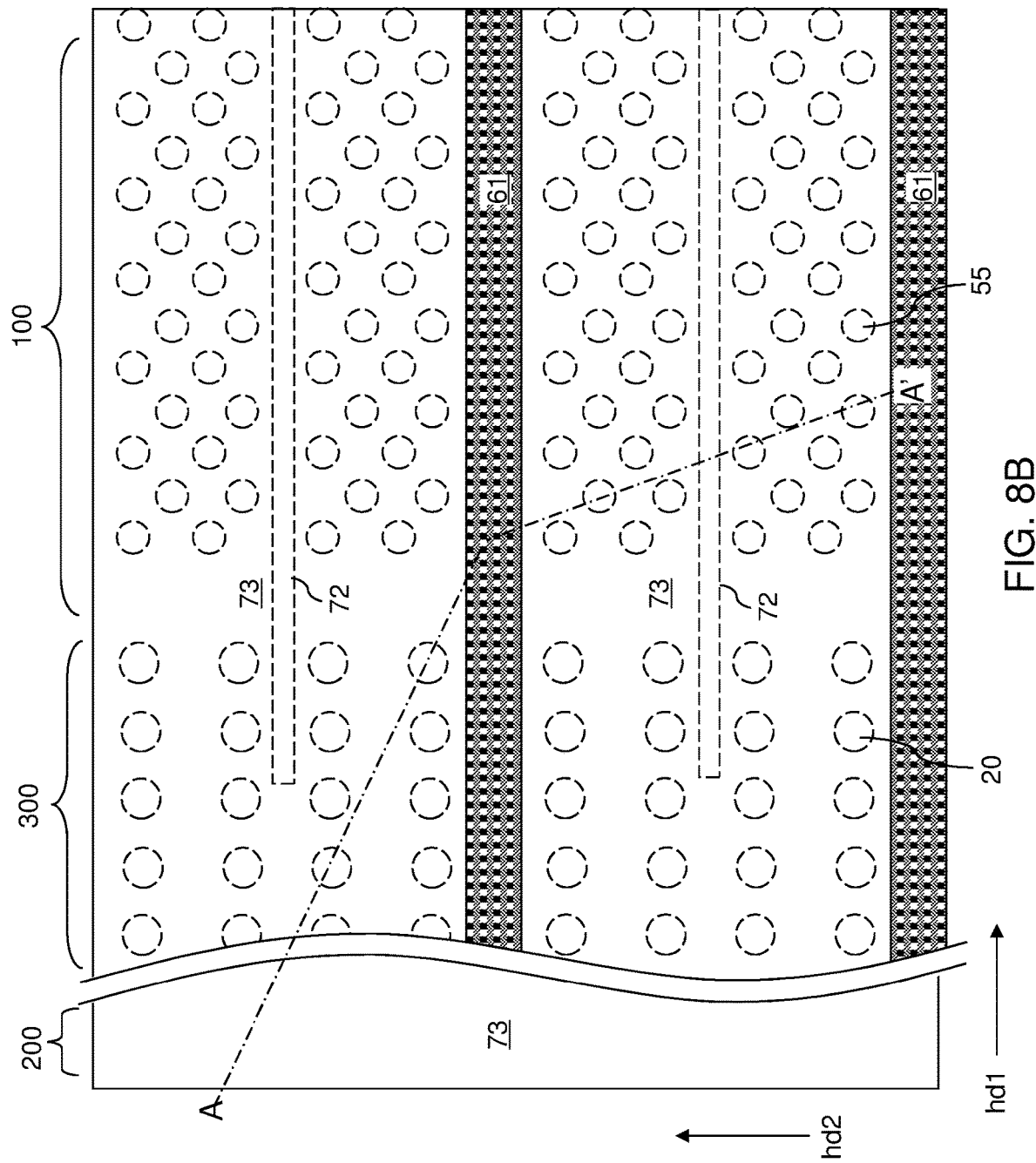
FIG. 8B is a partial see-through top-down view of the first exemplary structure of FIG. 8A. The vertical plane A-A' is the plane of the schematic vertical cross-sectional view of FIG. 8A.

Referring to FIGS. 8A and 8B, a contact-level dielectric layer 73 may be formed over the alternating stack (32, 46) of insulating layer 32 and electrically conductive layers 46, and over the memory opening fill structures 58 and the support pillar structures 20. The contact-level dielectric layer 73 includes a dielectric material that is different from the dielectric material of the electrically conductive layers 46. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) may be applied over the contact-level dielectric layer 73, and is lithographically patterned to form openings in areas between clusters of memory opening fill structures 58. The pattern in the photoresist layer may be transferred through the contact-level dielectric layer 73, the alternating stack (32, 46) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

Dopants of the second conductivity type may be implanted into portions of the semiconductor material layer 10 that underlie the bottom surfaces of the backside trenches 79. Source regions 61 having a doping of the second conductivity type can be formed at the bottom of each backside trench 79. Each horizontally-extending surface portion of the semiconductor material layer 10 that laterally extends between a source region 61 and bottom surfaces of adjacent vertical semiconductor channels 60 constitutes a horizontal semiconductor channel 59.

In one embodiment, the backside trenches 79 can laterally extend along a first horizontal direction hd1 and may be laterally spaced apart from each other along a second horizontal direction hd2 that is perpendicular to the first horizontal direction hd1. The memory opening fill structures 58 may be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 may be located between a neighboring pair of a backside trench 79 and a drain select level isolation structure 72, or between a neighboring pair of drain select level isolation structures 72. In one embodiment, the backside trenches 79 can include a source contact opening in which a source contact via structure may be subsequently formed. The photoresist layer may be removed, for example, by ashing.

Figure 9:
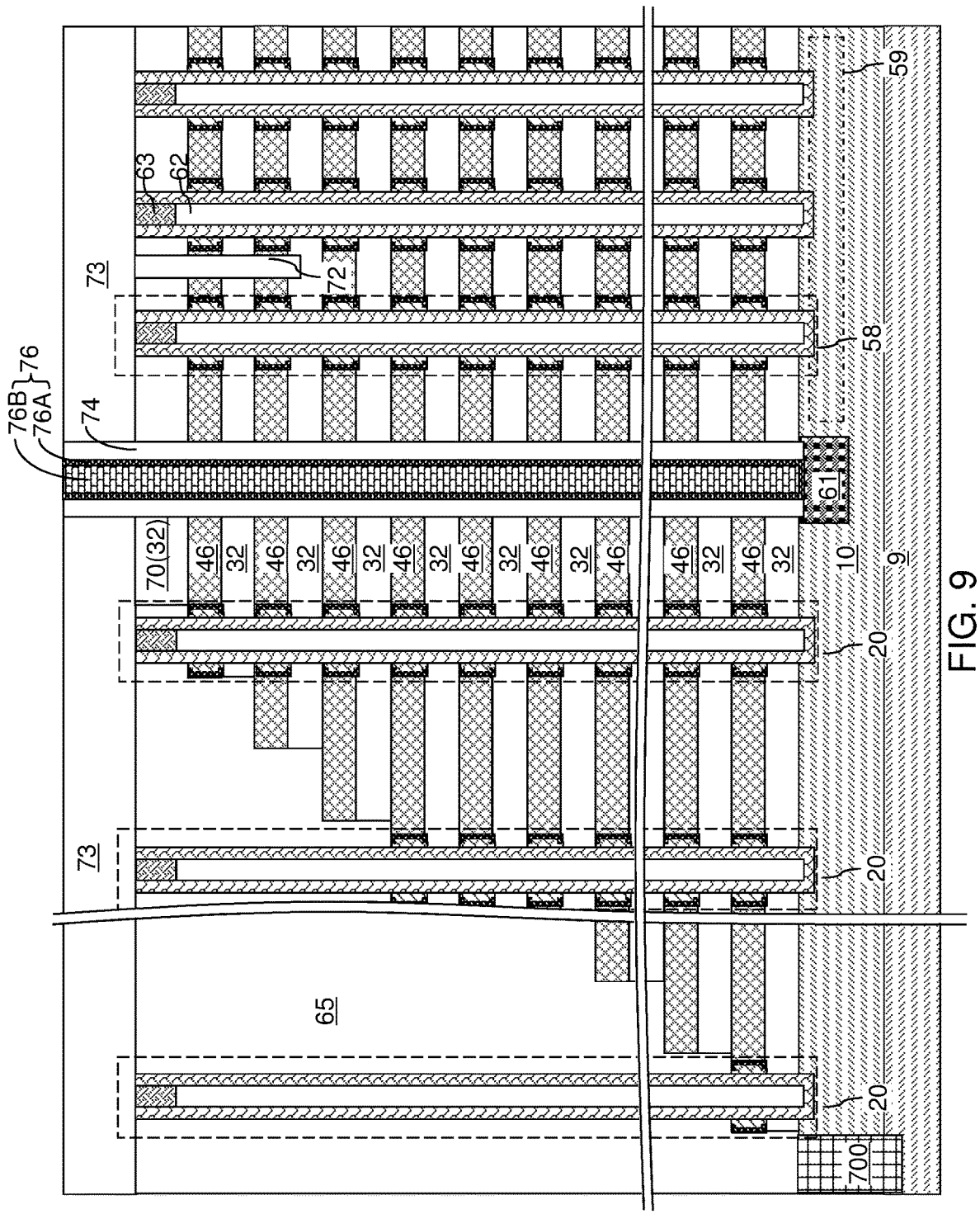
FIG. 9 is a schematic vertical cross-sectional view of the first exemplary structure after formation of a tubular insulating spacer and a backside contact structure in each backside trench according to the first embodiment of the present disclosure.

Referring to FIG. 9, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes a tubular insulating spacer 74. A backside cavity is present within a volume surrounded by each tubular insulating spacer 74. A top surface of the semiconductor material layer 10 can be physically exposed at the bottom of each backside trench 79.

A backside contact via structure 76 can be formed within each backside cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 10A:
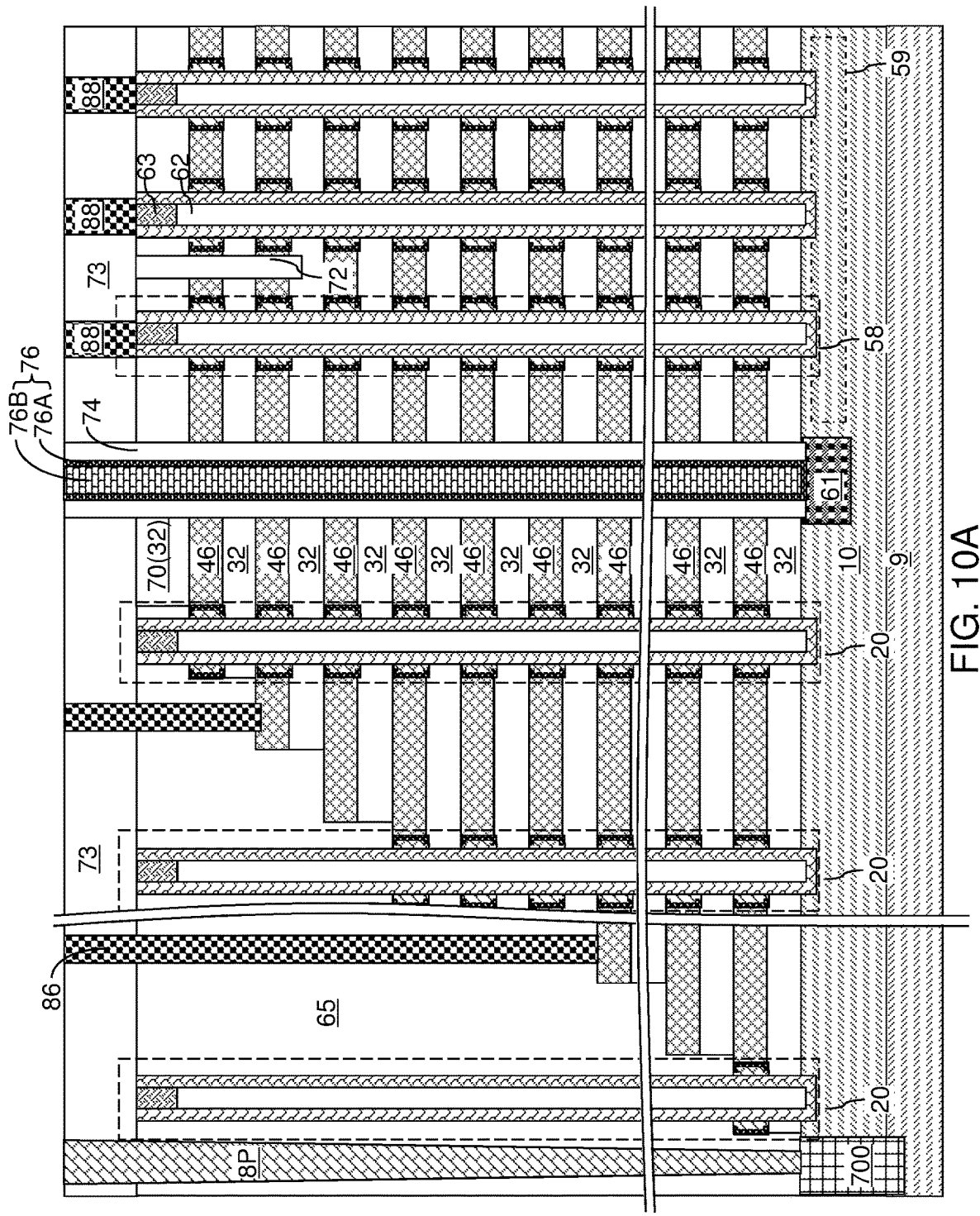
FIG. 10A is a schematic vertical cross-sectional view of the first exemplary structure after formation of additional contact via structures according to the first embodiment of the present disclosure.
Figure 10B:
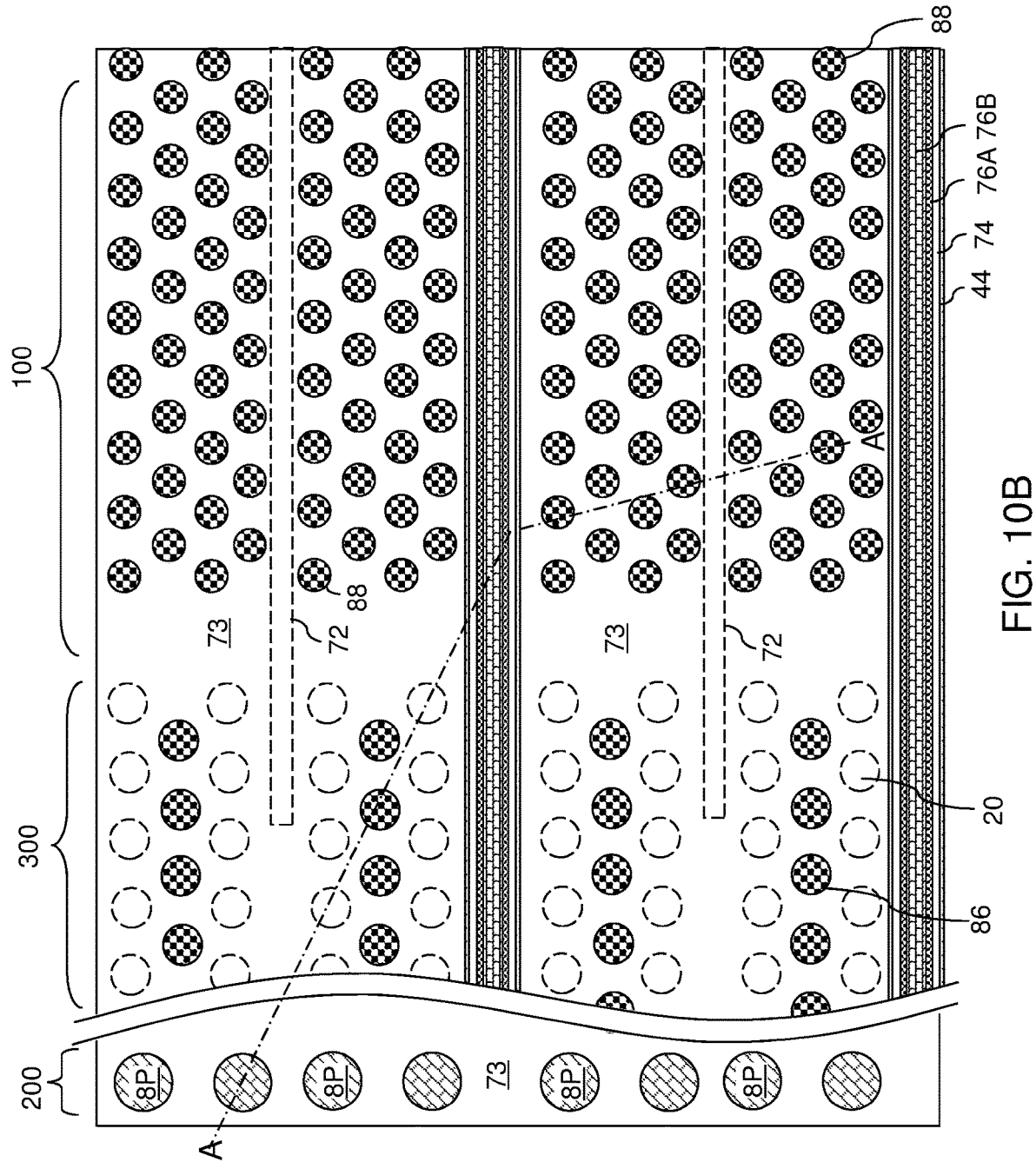
FIG. 10B is a top-down view of the first exemplary structure of FIG. 10A. The vertical plane A-A' is the plane of the schematic vertical cross-sectional view of FIG. 10A.

Referring to FIGS. 10A and 10B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to FIG. 11, a second exemplary structure according to a second embodiment of the present disclosure can be derived from the first exemplary structure illustrated in FIG. 1 by forming an alternating stack (32, 42) of insulating layers 32 and sacrificial material layers 42 over the semiconductor material layer 10. In one embodiment, the alternating stack (32, 42) can include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer.

Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 may be deposited, for example, by chemical vapor deposition (CVD). For example, if silicon oxide is employed for the insulating layers 32, tetraethyl orthosilicate (TEOS) may be employed as the precursor material for the CVD process. The second material of the sacrificial material layers 42 may be formed, for example, CVD or atomic layer deposition (ALD).

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42. In one embodiment, the topmost layer of the alternating stack (32, 42) may comprise a topmost insulating layer 70.

Figure 12A:
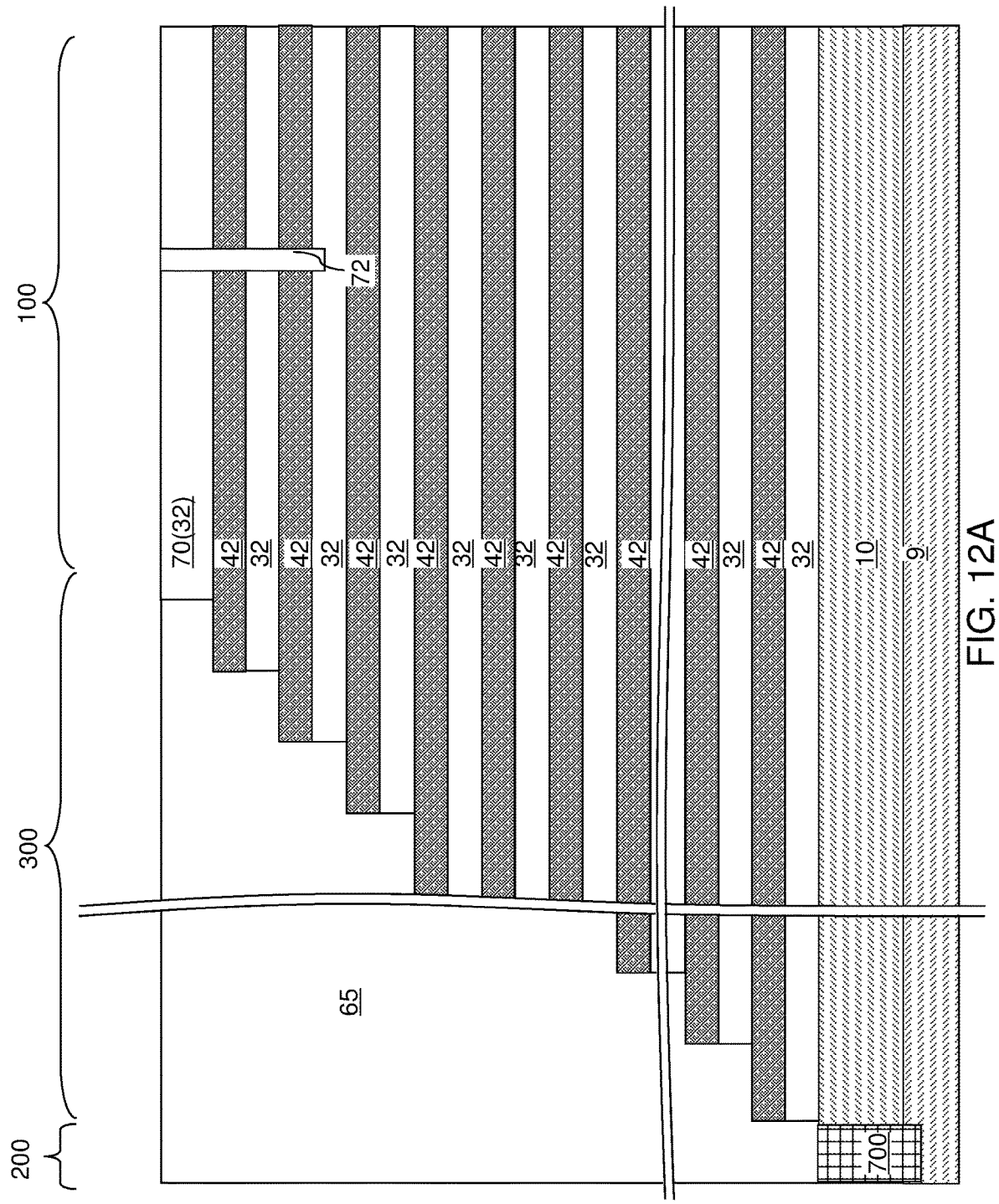
FIG. 12A is a schematic vertical cross-sectional view of the second exemplary structure after formation of stepped terraces and a retro-stepped dielectric material portion according to the second embodiment of the present disclosure.
Figure 12B:
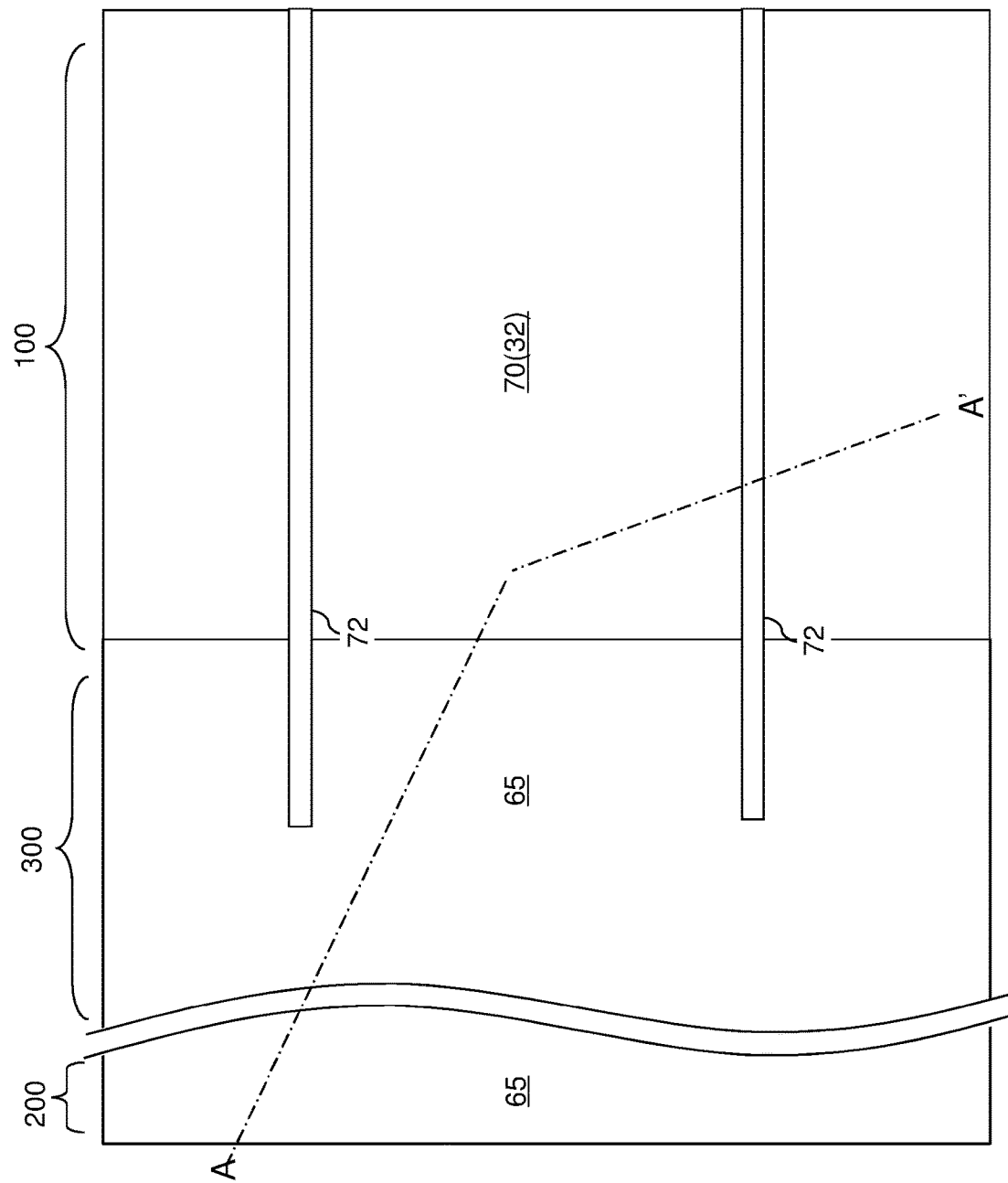
FIG. 12B is a top-down view of the second exemplary structure of FIG. 12A. The vertical plane A-A' is the plane of the cross-section for FIG. 12A.

Referring to FIGS. 12A and 12B, stepped surfaces are optionally formed at a peripheral region of the alternating stack (32, 42), which is herein referred to as a terrace region. A stepped cavity is formed within the volume from which portions of the alternating stack (32, 42) are removed through formation of the stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the topmost insulating layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the topmost insulating layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the topmost insulating layer 70.

Figure 13A:
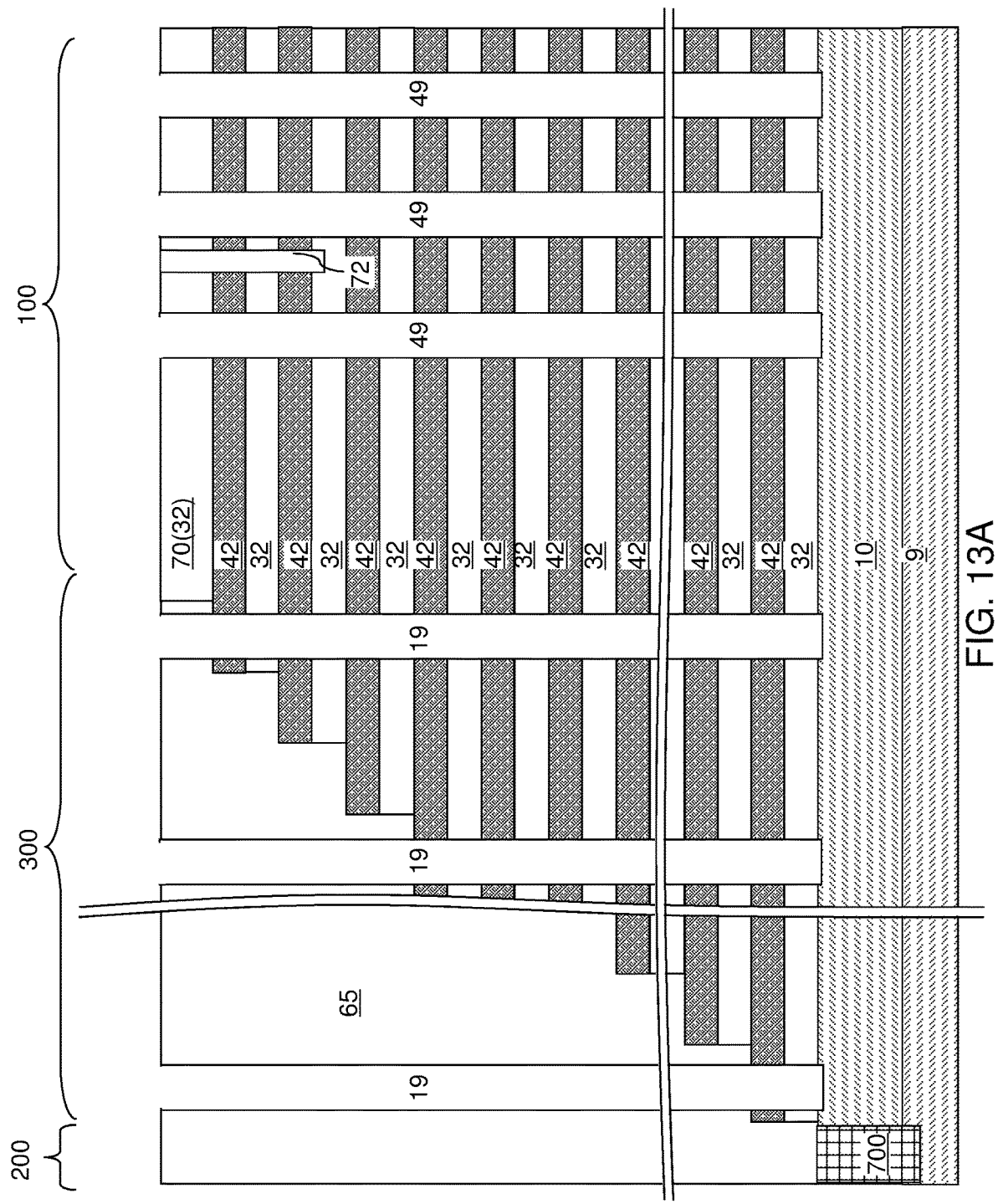
FIG. 13A is a schematic vertical cross-sectional view of the second exemplary structure after formation of memory openings and support openings according to the second embodiment of the present disclosure.
Figure 13B:
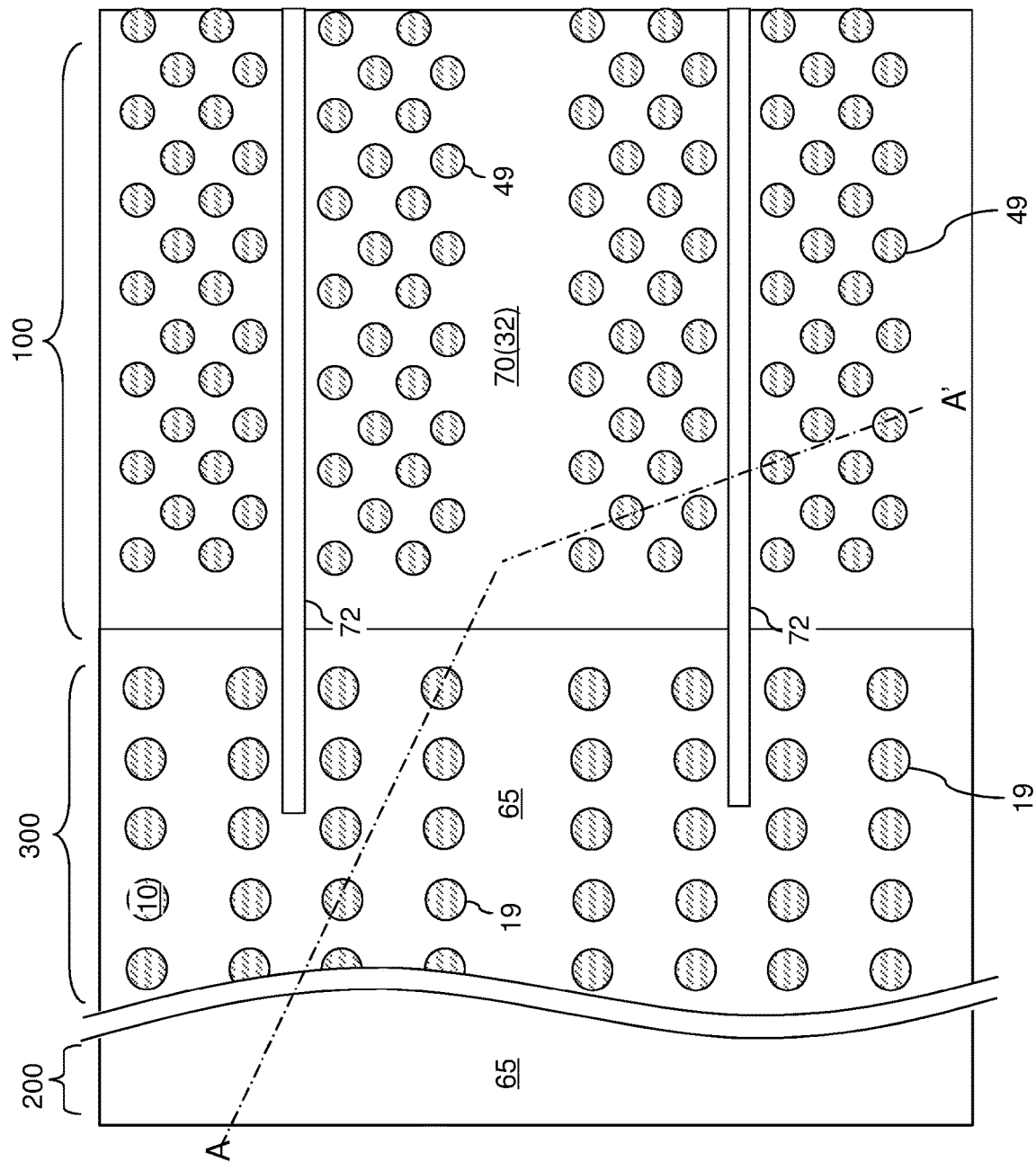
FIG. 13B is a top-down view of the second exemplary structure of FIG. 13A. The vertical plane A-A' is the plane of the cross-section for FIG. 13A.

Referring to FIGS. 13A and 13B, a lithographic material stack (not shown) including at least a photoresist layer may be formed over the topmost insulating layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the topmost insulating layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 70 and the entirety of the alternating stack (32, 42) in the memory array region 100. The support openings 19 are formed through the retro-stepped dielectric material portion and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths can also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate.

Figure 14:
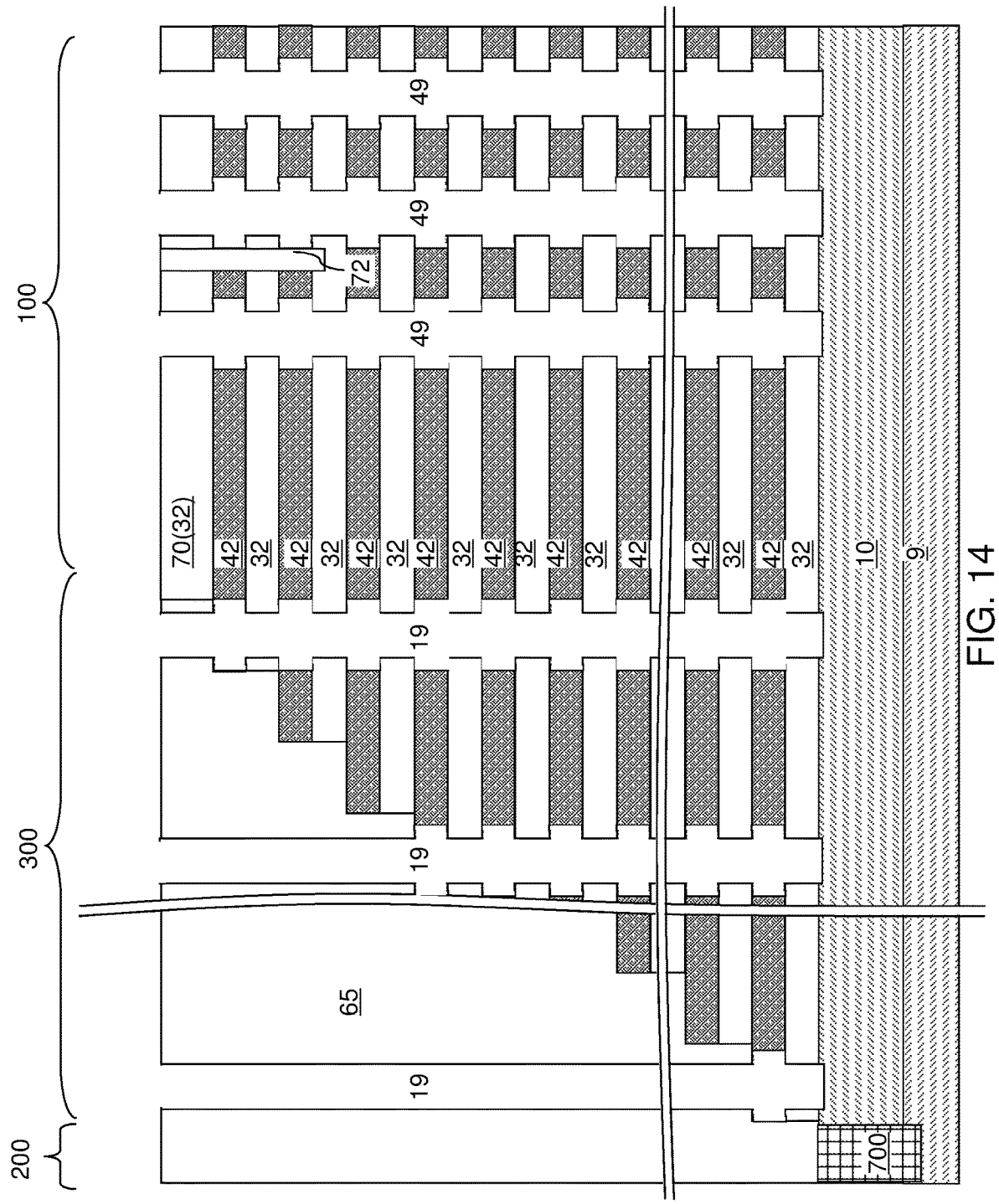
FIG. 14 is a vertical cross-sectional view of the second exemplary structure after laterally recessing sidewalls of the sacrificial material layers around the memory openings and around the support openings according to the second embodiment of the present disclosure.

Referring to FIG. 14, an isotropic etch process can be performed to recess sidewalls of the sacrificial material layers 42 around the memory openings 49 and around the support openings 19. The isotropic etch process has an etch chemistry that etches the material of the sacrificial material layers 42 selective to the material of the insulating layers 32. For example, the isotropic etch process may comprise a wet etch process (e.g., a hot phosphoric acid process) that etches silicon nitride selective to the dielectric material of the insulating layers 32 (such as silicon oxide). Lateral recesses 49R are formed at levels of the sacrificial material layers 42 around the memory opening 49 by isotropically etching the sacrificial material layers 42 selective to the insulating layers 32. The lateral recess distance of the isotropic etch process, as measured between a vertical plane including sidewalls of the insulating layers 32 and a vertical plane including recessed sidewalls of the sacrificial material layers 42, around each memory opening 49 may be in a range from 10 nm to 100 nm, such as from 20 nm to 50 nm, although lesser and greater lateral recess distances may also be employed.

FIGS. 15A-15H are sequential schematic vertical cross-sectional views of a memory opening 49 within the second exemplary structure during formation of ferroelectric memory structures (52, 54) in a second configuration, a vertical semiconductor channel 60, and a dielectric core 62 according to a second embodiment of the present disclosure.

Referring to FIG. 15A, a region of a memory opening 49 is illustrated after formation of a vertical stack of annular lateral recesses 49R. The annular lateral recesses 49R may be formed at each level of the sacrificial material layers 42.

Referring to FIG. 15B, a continuous crystalline template material layer 52L can be deposited, as described above with respect to FIG. 6B of the first embodiment.

Referring to FIG. 15C, an anisotropic etch process can be performed to remove portions of the continuous crystalline template material layer 52L that are located outside the volumes of the lateral recesses in the memory openings 49 and in the support openings 19 to form the crystalline template material portions 52, as described above with respect to FIG. 6C of the first embodiment.

Referring to FIG. 15D, the dielectric material layer 53L can be conformally deposited in remaining volumes of the lateral recesses 49R and at peripheral regions of the memory openings 49 and the support openings 19, as described above with respect to FIG. 6D of the first embodiment.

Referring to FIG. 15E, an etch process can be performed to remove vertically-extending portions of the dielectric material layer 53L that are located outside the volumes of the lateral recesses 49R, as described above with respect to FIG. 6E of the first embodiment. Referring to FIG. 15F, an anneal process may be performed to convert the dielectric material portions 53 into crystalline ferroelectric material portions 54, as described above with respect to FIG. 6F of the first embodiment.

Referring to FIG. 15G, a semiconductor material can be deposited in each memory opening 49 and in each support opening to form the vertical semiconductor channels 60, as described above with respect to FIG. 6G of the first embodiment.

Referring to FIG. 15H, the dielectric core 62 may be formed as described above with respect to FIG. 6H of the first embodiment.

Subsequently, the processing steps described with reference to FIG. 7 can be performed to form a drain region 63 at an upper end of each vertical semiconductor channel 60 within the memory openings 49 and within the support openings 19.

FIGS. 16A-16H are sequential schematic vertical cross-sectional views of a memory opening 49 within the second exemplary structure during formation of ferroelectric memory structures (52, 54) in a third configuration, a vertical semiconductor channel 60, and a dielectric core 62 according to a third embodiment of the present disclosure.

Referring to FIG. 16A, the second exemplary structure for forming ferroelectric memory structures (52, 54) in the third configuration at this processing step may be the same as the second configuration of the second exemplary structure at the processing step of FIG. 15A.

Referring to FIG. 16B, a continuous crystalline template material layer 52L is formed. The continuous crystalline template material layer 52L may have a greater thickness than the layer 52L in FIG. 15B of the second configuration. Alternatively, the continuous crystalline template material layer 52L may be formed by a deposition process that grows a crystalline template material at a higher growth rate from physically exposed surfaces of the sacrificial material layers 42 than from physically exposes surfaces of the insulating layers 32. Generally, the material of the continuous crystalline template material layer 52L at this processing step may be the same as the material of the continuous crystalline template material layer 52L described with reference to FIG. 15B. However, the deposition process employed at the processing steps of FIG. 16B may have a deposition mechanism that provide a thicker crystalline template material at least over the surfaces of the sacrificial material layers 42 than over the surfaces of the insulating layers 32. In one embodiment, an atomic layer deposition process may be employed which has a nucleation mechanism that provides faster nucleation on the surfaces of the sacrificial material layers 42 than on the surfaces of the insulating layers 32. The continuous crystalline template material layer 52L may have a greater thickness over the sidewalls of the sacrificial material layers 42 than over the surfaces of the insulating layers 32.

Referring to FIG. 16C, a combination of anisotropic and isotropic etch processes may be subsequently performed to recess the continuous crystalline template material layer 52L. The anisotropic etch process may be a dry etch process which removes vertical portion of the continuous crystalline template material layer 52L. The isotropic etch process may be a wet etch process which laterally recesses the remaining portions of the crystalline template material layer 52L located in the lateral recesses 49R. The order of the isotropic and anisotropic etch steps may be reversed in an alternative embodiment. Remaining portions of the continuous crystalline template material layer 52L comprise crystalline template material portions 52 for forming ferroelectric memory structures (52, 54) in the third configuration.

Each crystalline template material portion 52 may have a cylindrical configuration. The lateral thickness (as measured between an outer sidewall and an inner sidewall) of each crystalline template material portion 52 may be in a range from 2 nm to 10 nm, although lesser and greater thicknesses may also be employed. Each crystalline template material portion 52 may have an outer sidewall that vertically extends from a horizontal top surface of a respective underlying insulating layer 32 to a horizontal bottom surface of a respective overlying insulating layer 32. In one embodiment, the outer sidewall may be a cylindrical vertical sidewall. Each crystalline template material portion 52 may have an inner sidewall that vertically extends from a horizontal top surface of a respective underlying insulating layer 32 to a horizontal bottom surface of a respective overlying insulating layer 32. In one embodiment, the inner sidewall may be a cylindrical vertical sidewall. Each of the insulating layers 32 comprises at least one annular horizontal surface that is physically exposed to a respective one of the lateral recesses after formation of the crystalline template material portions 52.

Referring to FIG. 16D, the processing steps of FIG. 15D may be performed to form the dielectric material layer 53L.

Referring to FIG. 16E, the processing steps of FIG. 15E may be performed to pattern the dielectric material layer 53L into a vertical stack of dielectric material portions 53 within each of the memory openings 49.

Referring to FIG. 16F, the processing steps of FIG. 15F may be performed to anneal the vertical stacks of dielectric material portions 53 into vertical stacks of crystalline ferroelectric material portions 54.

Referring to FIG. 16G, the processing steps of FIG. 15G may be performed to form a vertical semiconductor channel 60 within each of the memory openings 49 and the support openings 19.

Referring to FIG. 16H, the processing steps of FIG. 15H may be performed to optionally form a dielectric core 62 within each of the memory openings 49 and the support openings 19.

Subsequently, the processing steps described with reference to FIG. 7 can be performed to form a drain region 63 at an upper end of each vertical semiconductor channel 60 within the memory openings 49 and within the support openings 19.

Figure 17:
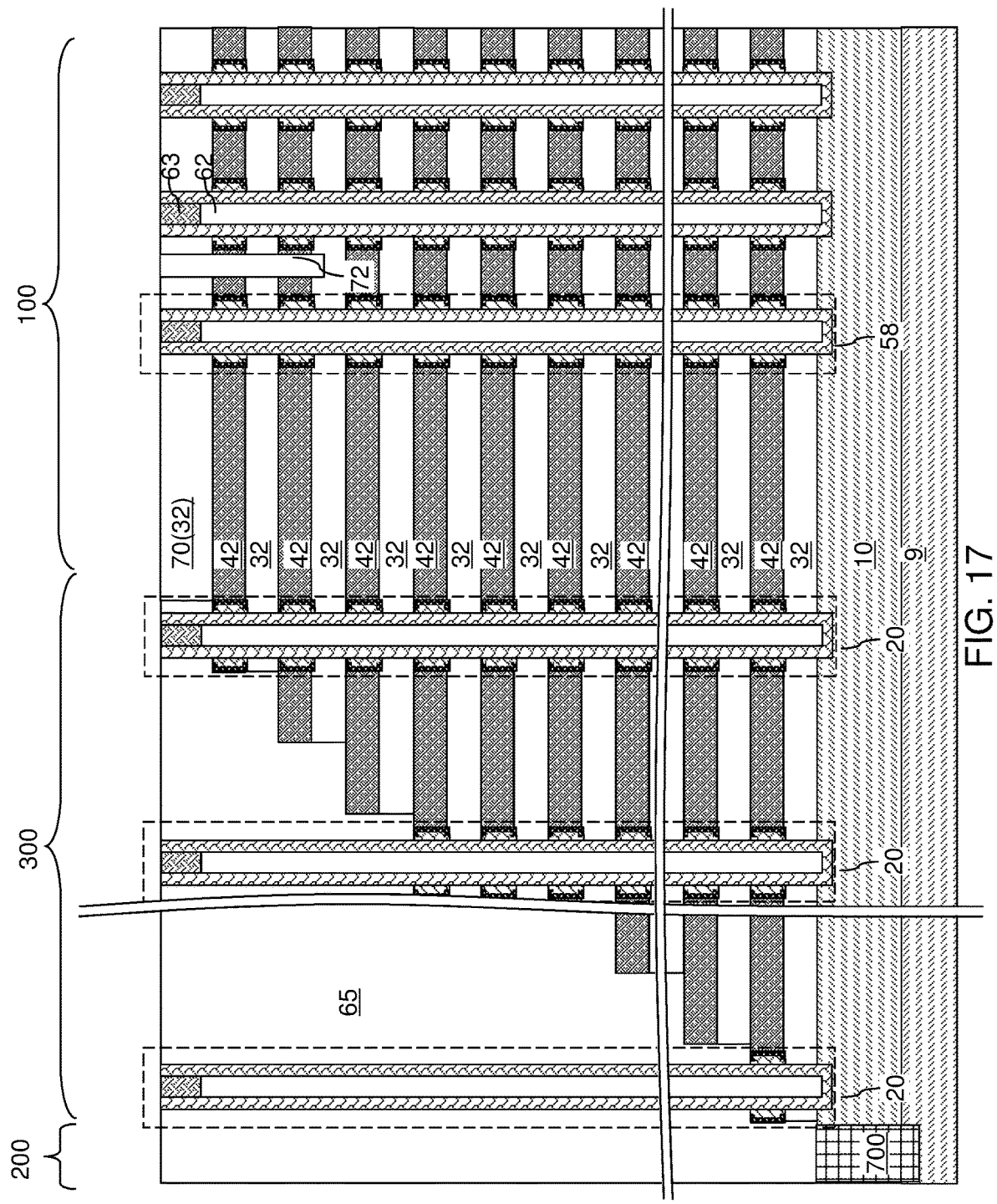
FIG. 17 is a schematic vertical cross-sectional view of the second exemplary structure after formation of memory stack structures and support pillar structures according to the second embodiment of the present disclosure.

Referring to FIG. 17, the second exemplary structure is illustrated after formation of the drain regions 63. The set of all material portions that fills a memory opening 49 constitutes a memory opening fill structure 58. The set of all material portions that fills a support opening 19 constitutes a support pillar structure 20. An instance of a memory opening fill structure 58 may be formed within each memory opening 49 of the structure of FIG. 14. An instance of the support pillar structure 20 may be formed within each support opening 19 of the structure of FIG. 14. Each vertical semiconductor channel 60 may contact a recessed surface of the semiconductor material layer 10.

Figure 18A:
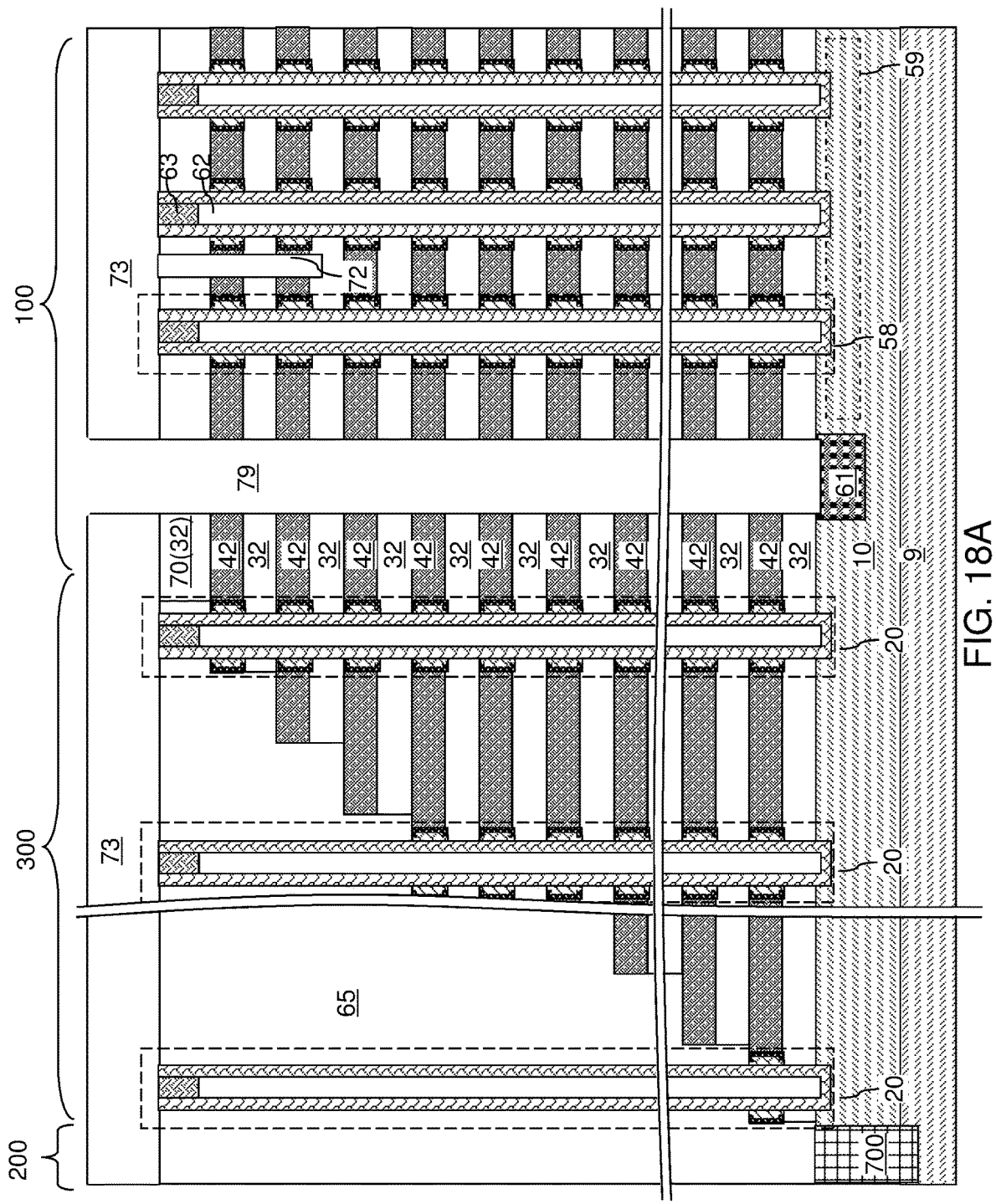
FIG. 18A is a schematic vertical cross-sectional view of the second exemplary structure after formation of backside trenches according to the second embodiment of the present disclosure.
Figure 18B:
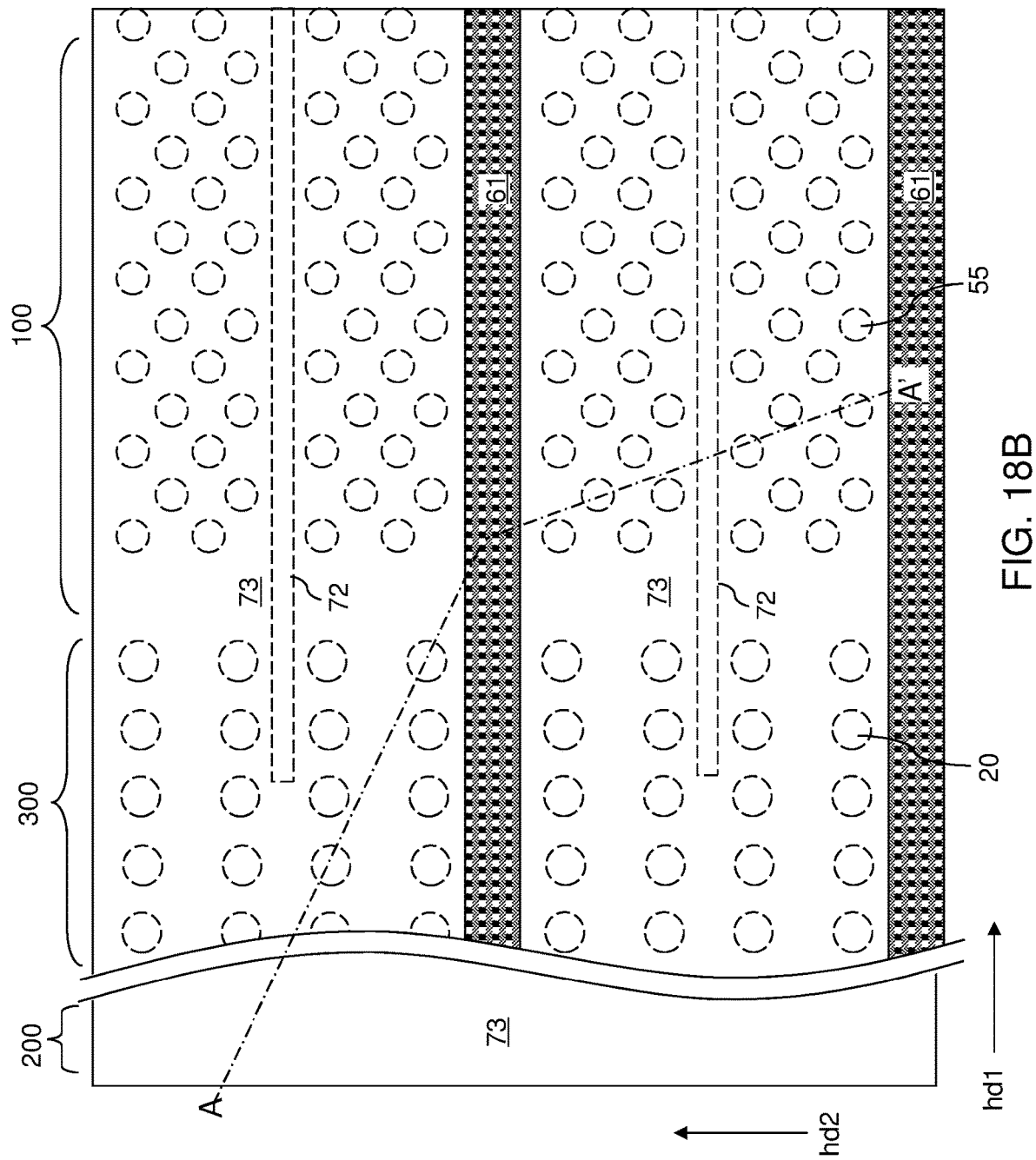
FIG. 18B is a partial see-through top-down view of the second exemplary structure of FIG. 18A. The vertical plane A-A' is the plane of the schematic vertical cross-sectional view of FIG. 18A.

Referring to FIGS. 18A and 18B, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain-select-level isolation structure 72, or between a neighboring pair of drain-select-level isolation structures 72.

In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 19:
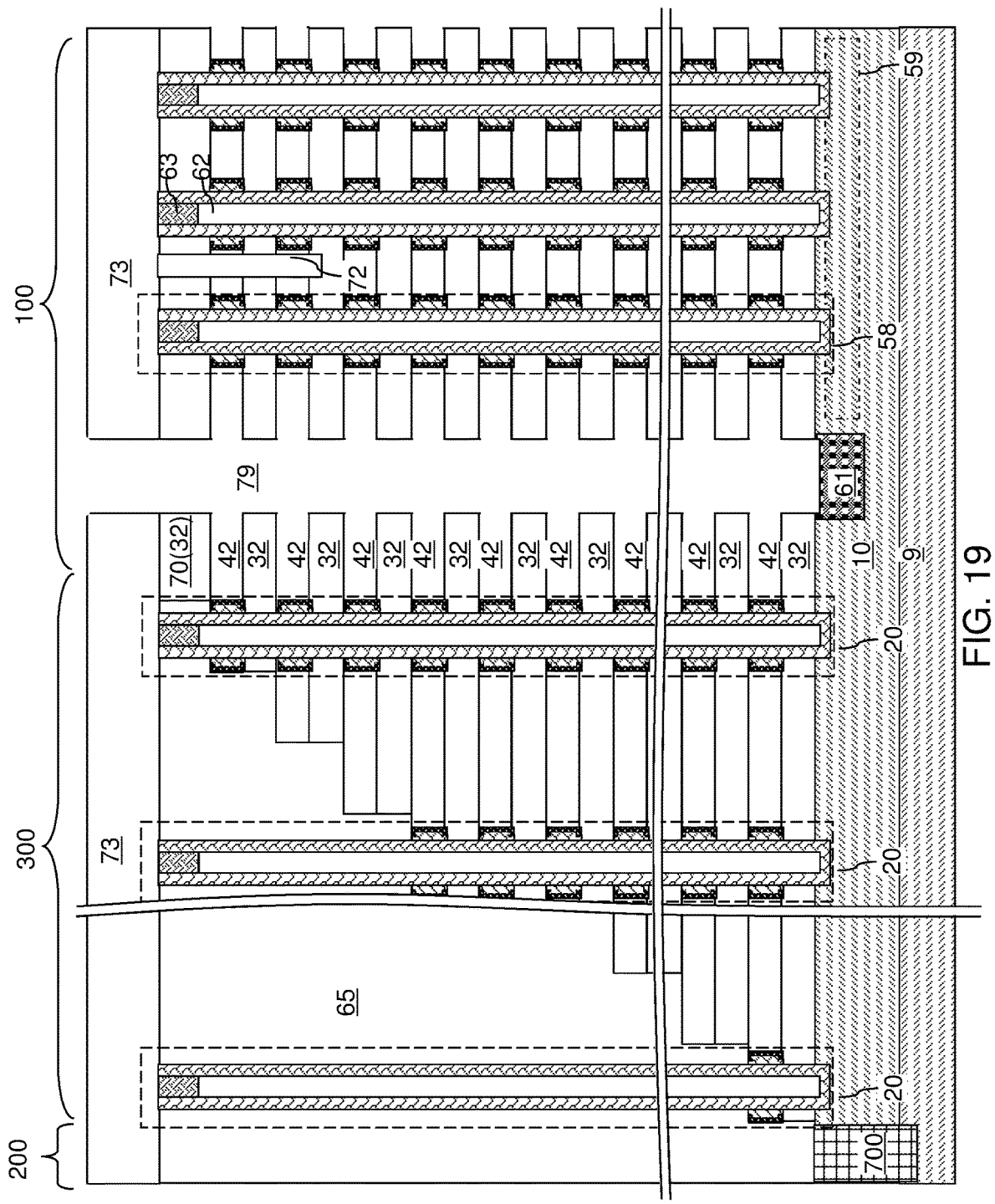
FIG. 19 is a schematic vertical cross-sectional view of the second exemplary structure after formation of backside recesses according to the second embodiment of the present disclosure.

Referring to FIG. 19, an etchant that selectively etches the second material of the sacrificial material layers 42 with respect to the first material of the insulating layers 32 and the material of the crystalline template material portions 52 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the crystalline template material portions 52. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the crystalline template material portions 52 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 20C:
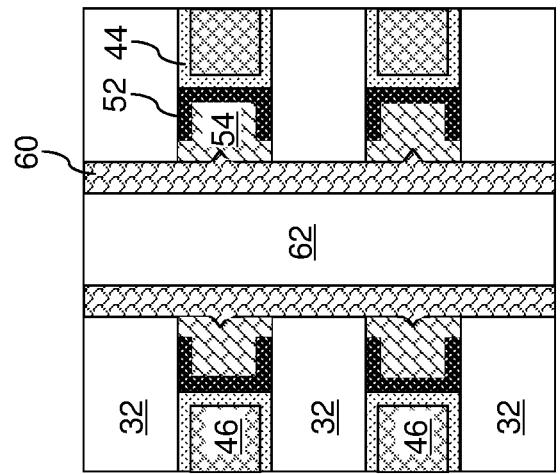
FIGS. 20A-20C are sequential vertical cross-sectional views of a region around ferroelectric memory structures in the second configuration during formation of electrically conductive layers according to the second embodiment of the present disclosure.
Figure 20B:
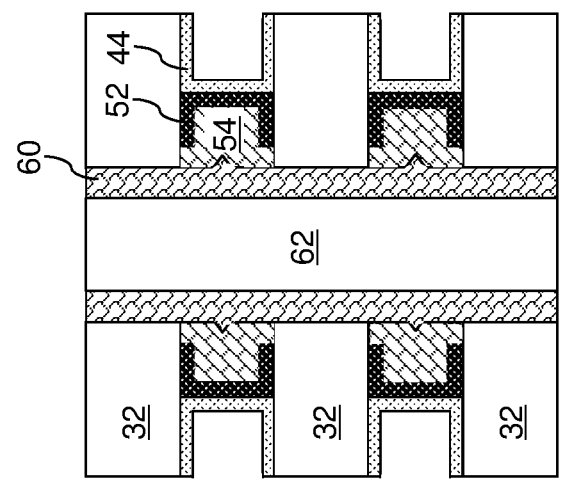
Figure 20A:
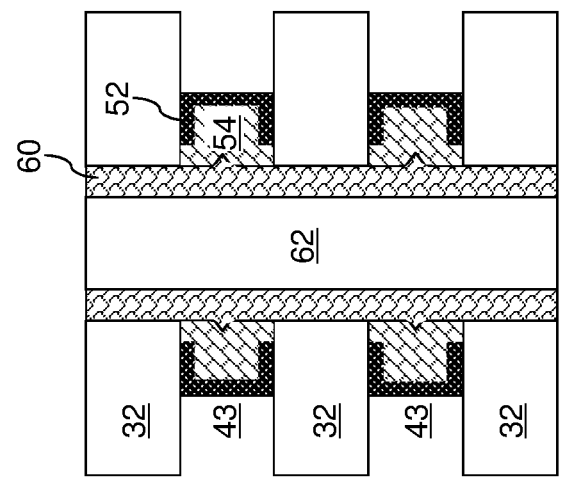

FIGS. 20A-20C are sequential vertical cross-sectional views of a region around ferroelectric memory structures (52, 54) in the second configuration of FIG. 15H during formation of electrically conductive layers 46 according to the second embodiment of the present disclosure.

Referring to FIG. 20A, the second exemplary structure is illustrated after the processing steps of FIG. 19 in case the ferroelectric memory structures (52, 54) have the second configuration.

Referring to FIG. 20B, a backside dielectric liner 44 can be optionally formed. The backside dielectric liner 44, if present, comprises a dielectric material that functions as a control gate dielectric for the control gates to be subsequently formed in the backside recesses 43.

The backside dielectric liner 44 can be formed in the backside recesses 43 and on a sidewall of the backside trench 79. The backside dielectric liner 44 can be formed directly on horizontal surfaces of the insulating layers 32 and sidewalls of the crystalline template material portions 52 within the backside recesses 43. In one embodiment, the backside dielectric liner 44 can be formed by a conformal deposition process such as atomic layer deposition (ALD). The thickness of the backside dielectric liner 44 can be in a range from 1 nm to 15 nm, such as 2 to 6 nm, although lesser and greater thicknesses can also be employed.

The dielectric material of the backside dielectric liner 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside dielectric liner 44 can include a silicon oxide layer. The backside dielectric liner 44 can be deposited by a conformal deposition method such as chemical vapor deposition or atomic layer deposition. The backside dielectric liner 44 is formed on the sidewalls of the backside trenches 79, horizontal surfaces and sidewalls of the insulating layers 32, and outer cylindrical sidewalls of the crystalline template material portions 52. A backside cavity is present within the portion of each backside trench 79 that is not filled with the backside dielectric liner 44.

Referring to FIG. 20C, at least one conductive material can be deposited in the backside recesses. For example, a combination of a metallic barrier layer and a metallic fill material can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited on the metallic barrier layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, or tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities.

A plurality of electrically conductive layers 46 can be formed in the plurality of backside recesses 43, and a continuous metallic material layer (not shown) can be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact-level dielectric layer 73.

Each sacrificial material layer 42 can be replaced with an electrically conductive layer 46. A backside cavity is present in the portion of each backside trench 79 that is not filled with the backside dielectric liner 44 and the continuous metallic material layer. The backside dielectric liners 44 embed a respective one of the electrically conductive layers 46, and laterally surrounds respective set of the crystalline ferroelectric material portions 54 that are located at the same level as the respective one of the electrically conductive layers 46. Each of the crystalline template material portions 52 is laterally spaced from a most proximal one among the electrically conductive layers 46 by a respective one of the backside dielectric liners 44. Each of the electrically conductive layers 46 is formed directly on a vertically-extending sidewall of a respective one of the crystalline template material portions 52 that vertically extends from a bottom surface of a respective overlying insulating layer 32 to a top surface of a respective underlying insulating layer 32.

In one embodiment, each of the crystalline template material portions 52 comprises a respective upper annular horizontal portion contacting a bottom surface of a respective overlying insulating layer 32 within the alternating stack (32, 42), a respective lower annular horizontal portion contacting a top surface of a respective underlying insulating layer 32 within the alternating stack (32, 42), and a respective tubular vertically-extending portion adjoined to an outer periphery of the respective upper annular horizontal portion and adjoined to an outer periphery of the respective lower annular horizontal portion.

Figure 21C:
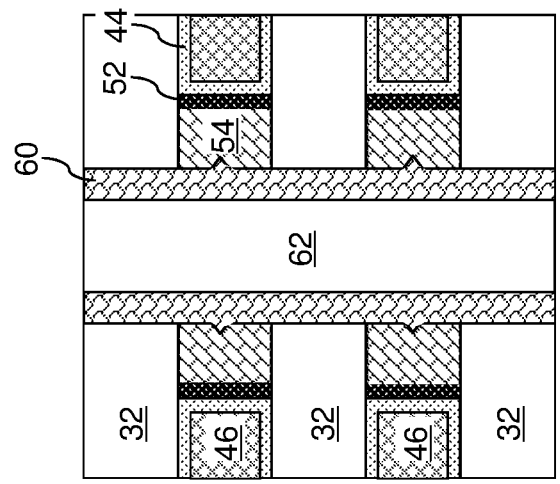
FIGS. 21A-21C are sequential vertical cross-sectional views of a region around ferroelectric memory structures in the third configuration during formation of electrically conductive layers according to the second embodiment of the present disclosure.
Figure 21B:
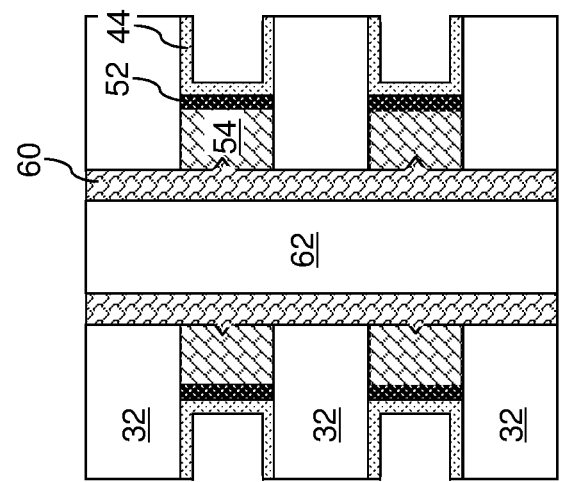
Figure 21A:
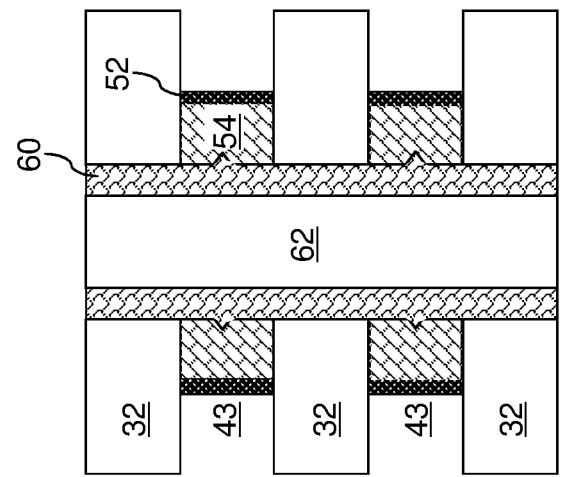

FIGS. 21A-21C are sequential vertical cross-sectional views of a region around ferroelectric memory structures (52, 54) in the third configuration of FIG. 16H during formation of electrically conductive layers 46 according to the second embodiment of the present disclosure.

Referring to FIG. 21A, the second exemplary structure is illustrated after the processing steps of FIG. 19 in case the ferroelectric memory structures (52, 54) has the third configuration. Each of the crystalline template material portions 52 has a respective tubular configuration and has an inner sidewall that vertically extends continuously from a respective underlying insulating layer 32 to a respective overlying insulating layer 32 among the insulating layers 32.

Referring to FIG. 21B, the processing steps described with reference to FIG. 20B can be performed to form a backside dielectric liner 44 in each of the backside recesses 43.

Referring to FIG. 21C, the processing steps described with reference to FIG. 20C can be performed to form an electrically conductive layer 46 in a remaining volume of each of the backside recesses 43.

Figure 22A:
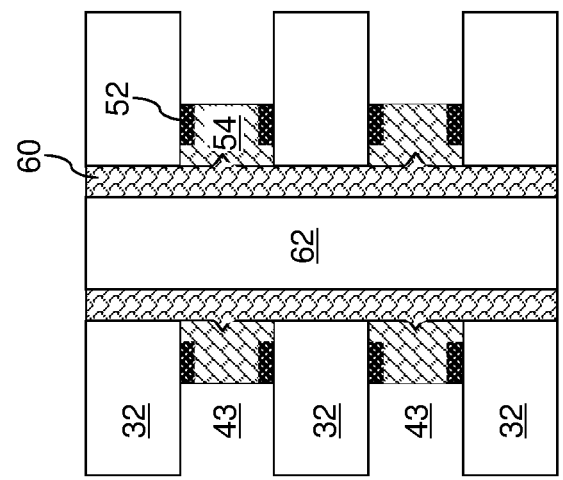
FIGS. 22A-22C are sequential vertical cross-sectional views of a region around a memory opening during formation of ferroelectric memory structures in a fourth configuration and during formation of electrically conductive layers according to the second embodiment of the present disclosure.
Figure 22B:
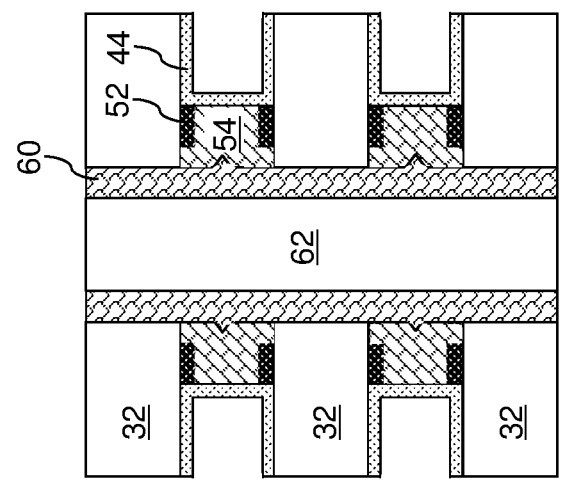
Figure 22C:
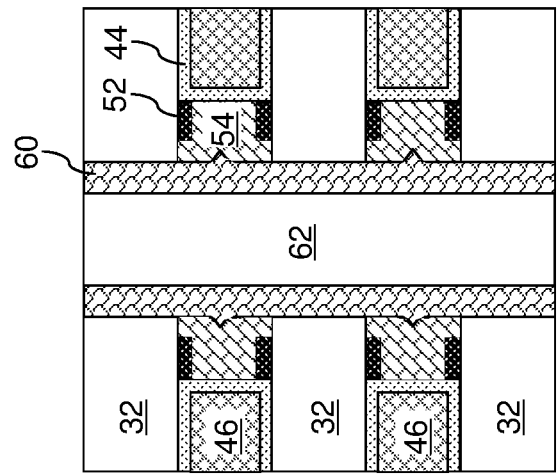

FIGS. 22A-22C are sequential vertical cross-sectional views of a region around a memory opening 49 during formation of ferroelectric memory structures (52, 54) in a fourth configuration and during formation of electrically conductive layers 46 according to the second embodiment of the present disclosure.

Referring to FIG. 22A, the fourth configuration of the ferroelectric memory structures (52, 54) can be derived from the third configuration of the ferroelectric memory structures (52, 54) illustrated in FIG. 20A by removing a vertically-extending portion of each of the crystalline template material portions 52 after formation of the backside recesses 43. In one embodiment, an additional isotropic etch process, such as a wet etch process, may be performed to isotropically etch the vertically-extending cylindrical portions of the crystalline template material portions 52 through the backside recesses 43 and the backside trench 79 so that cylindrical outer sidewalls of the crystalline ferroelectric material portions 54 are physically exposed to the backside recesses. Thus, sidewalls of a respective subset of the crystalline ferroelectric material portions 54 located at the same level as a backside recess 43 are physically exposed to the backside recess 43. In this case, each of the ferroelectric memory structures (52, 54) in the fourth configuration comprises two crystalline template material portions 52 that are vertically spaced from each other by the crystalline ferroelectric material portion 54. Each of the two crystalline template material portions 52 contacts a horizontal surface of a respective insulating layer 32.

Referring to FIG. 22B, the processing steps described with reference to FIG. 20B can be performed to form a backside dielectric liner 44 in each of the backside recesses 43. Each backside dielectric liner 44 may be formed directly on cylindrical outer sidewalls of a respective set of crystalline ferroelectric material portions 54 located at the same level as the backside dielectric liner 44.

Referring to FIG. 22C, the processing steps described with reference to FIG. 20C can be performed to form an electrically conductive layer 46 in a remaining volume of each of the backside recesses 43.

Figure 23A:
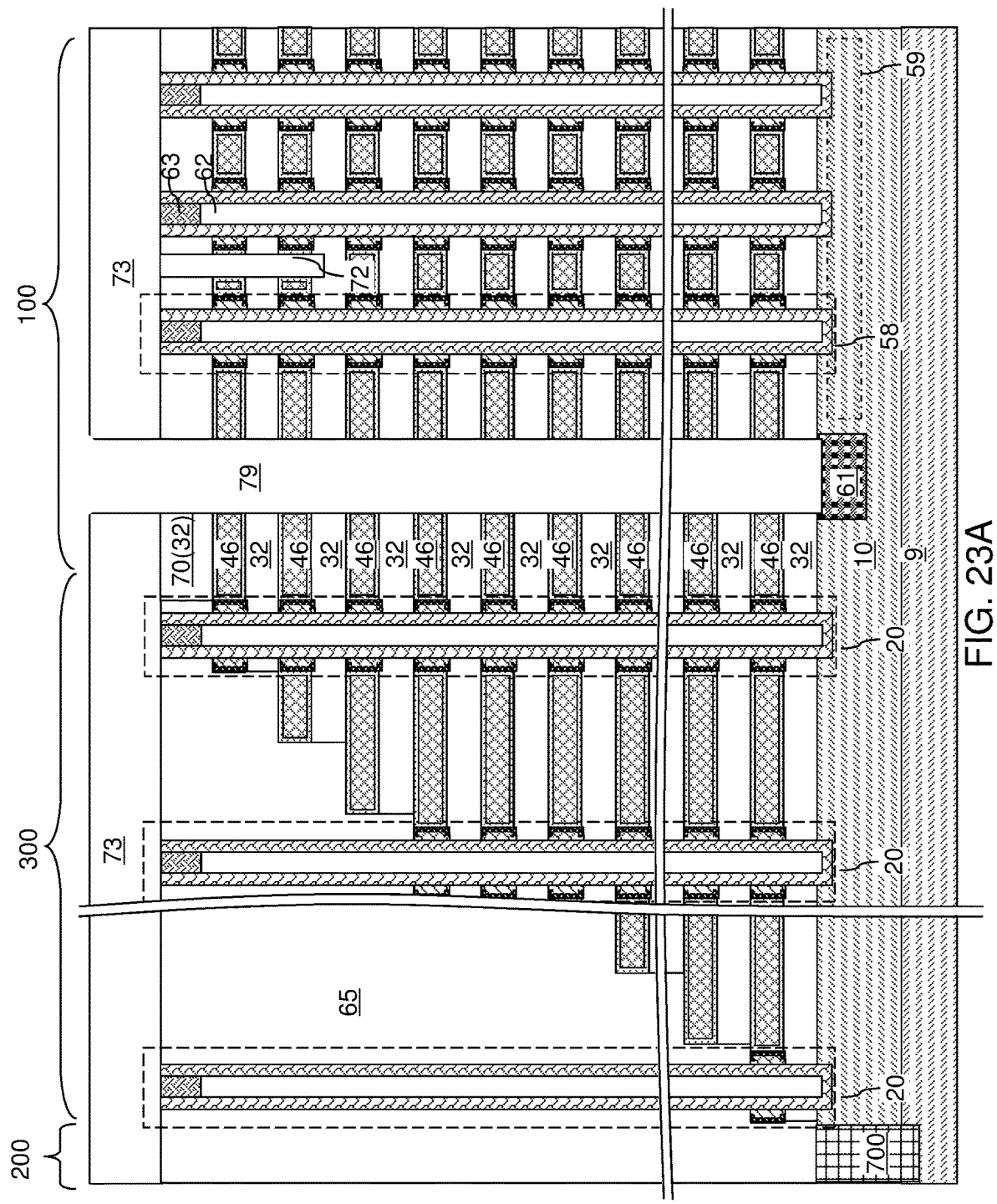
FIG. 23A is a schematic vertical cross-sectional view of the second exemplary structure after removal of a deposited conductive material from within the backside trench according to the second embodiment of the present disclosure.
Figure 23B:
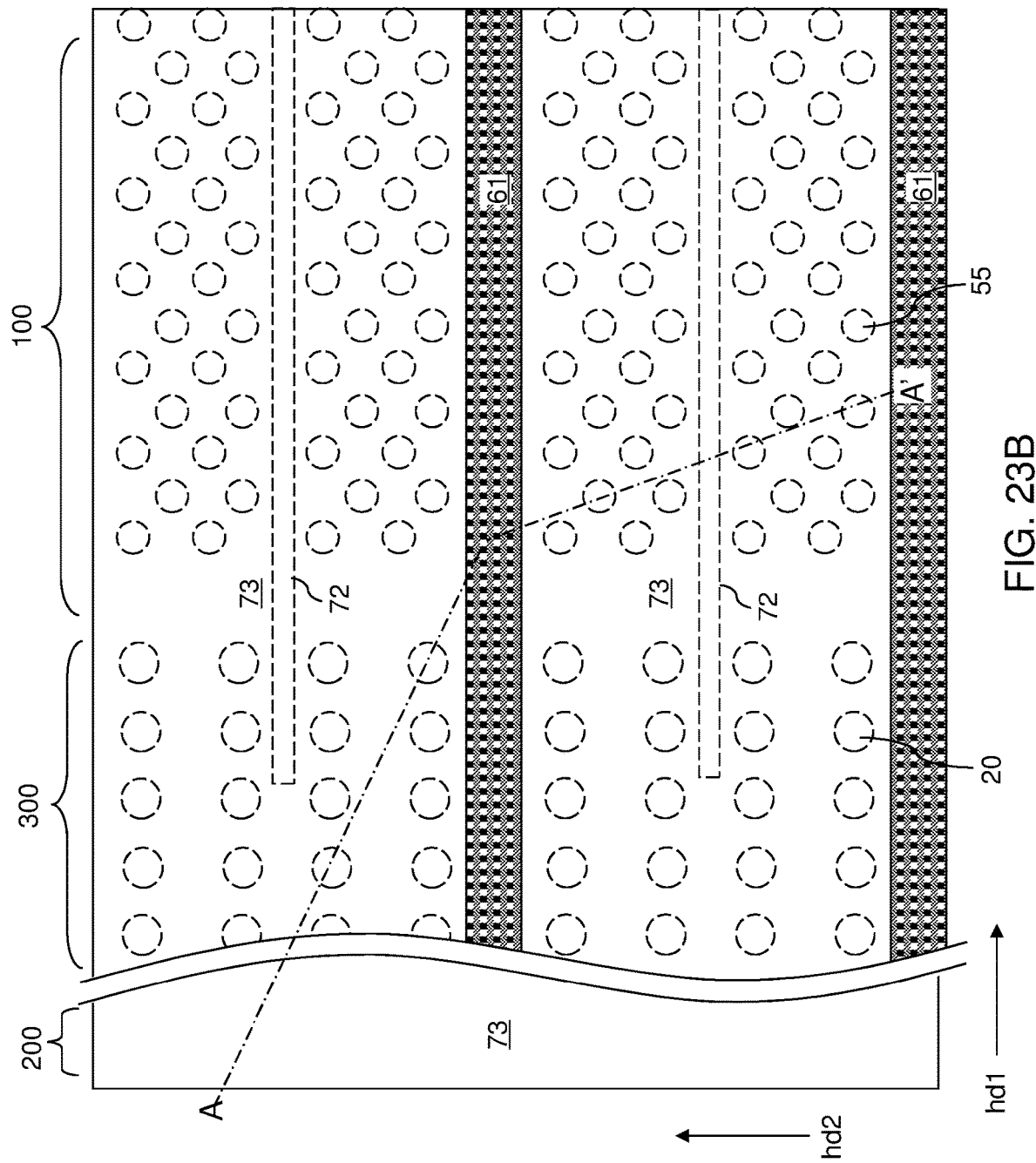
FIG. 23B is a partial see-through top-down view of the second exemplary structure of FIG. 23A. The vertical plane A-A' is the plane of the schematic vertical cross-sectional view of FIG. 23A.

Referring to FIGS. 23A and 23B, the deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including a respective vertical stack of ferroelectric memory structures (52, 54). In other words, each electrically conductive layer 46 can be a word line that functions as a common control gate electrode for the plurality of vertical memory devices.

In one embodiment, a bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 within the memory opening fill structures 58.

Figure 24:
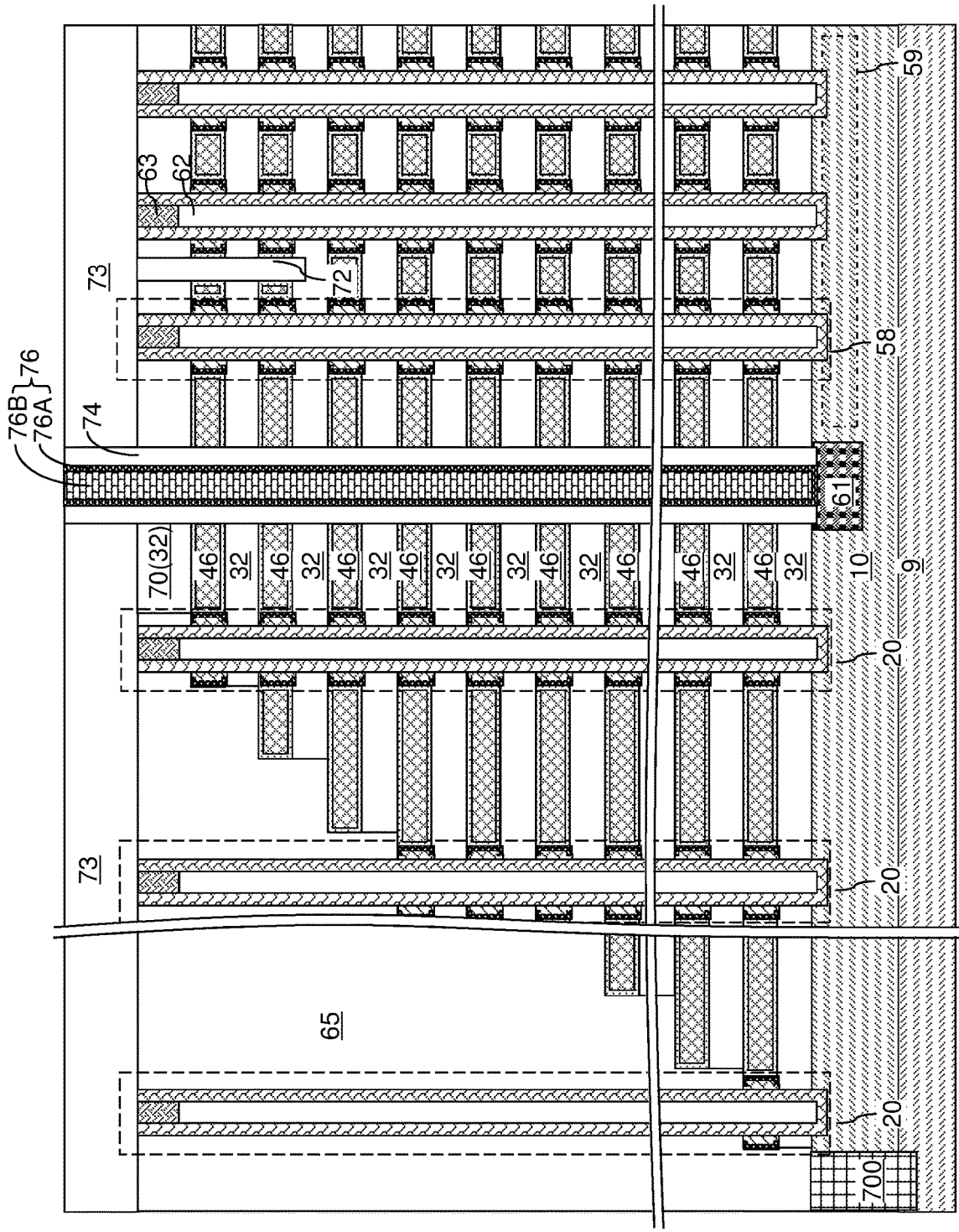
FIG. 24 is a schematic vertical cross-sectional view of the second exemplary structure after formation of a tubular insulating spacer and a backside contact structure in each backside trench according to the second embodiment of the present disclosure.

Referring to FIG. 24, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside dielectric liner 44 is present, the insulating material layer can be formed directly on surfaces of the backside dielectric liner 44 and directly on the sidewalls of the electrically conductive layers 46. If a backside dielectric liner 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes a tubular insulating spacer 74. A backside cavity is present within a volume surrounded by each tubular insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside dielectric liner 44 is employed, the backside contact via structure 76 can contact a sidewall of the backside dielectric liner 44.

Figure 25A:
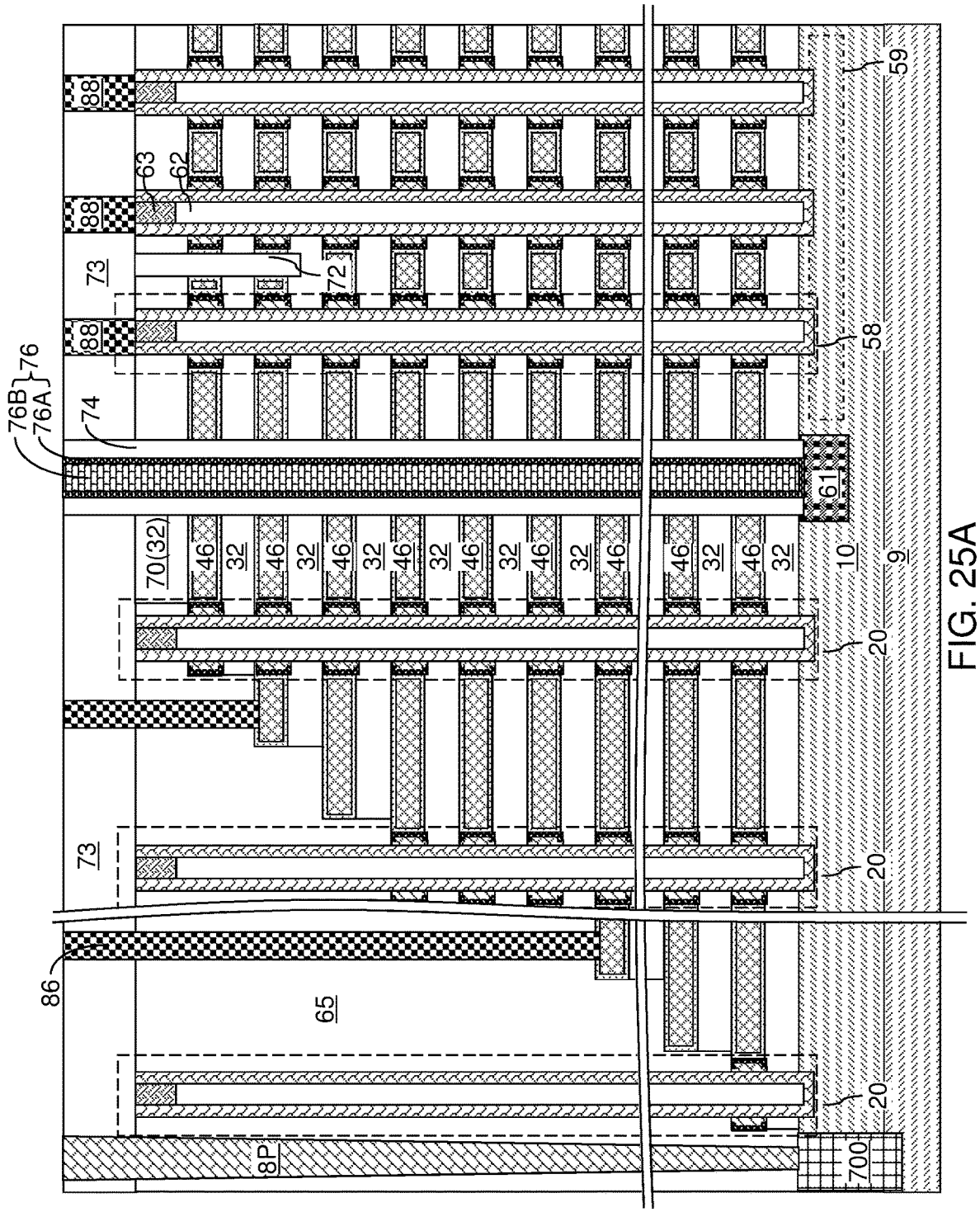
FIG. 25A is a schematic vertical cross-sectional view of the second exemplary structure after formation of additional contact via structures according to the second embodiment of the present disclosure.
Figure 25B:
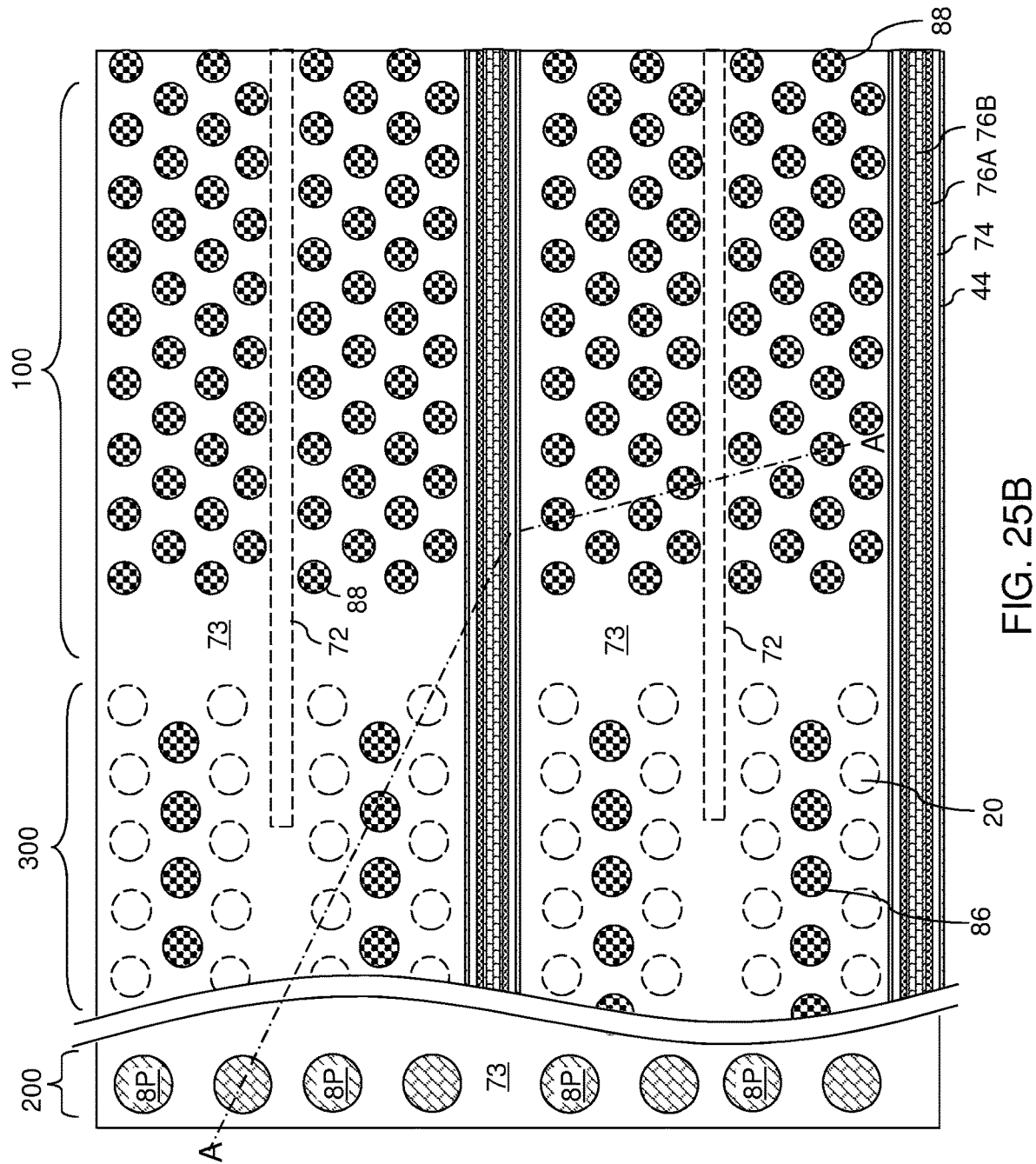
FIG. 25B is a top-down view of the second exemplary structure of FIG. 25A. The vertical plane A-A' is the plane of the schematic vertical cross-sectional view of FIG. 25A.

Referring to FIGS. 25A and 25B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a ferroelectric memory device comprises an alternating stack (32, 46) of insulating layers 32 and electrically conductive layers 46; a memory opening 49 extending vertically through the alternating stack (32, 46) and including laterally-protruding portions at levels of the electrically conductive layers 46; and a memory opening fill structure 58 located in the memory opening 49 and comprising a vertical semiconductor channel 60 and a vertical stack of discrete ferroelectric memory structures (52, 54) located in the laterally-protruding portions of the memory opening 49. Each of the ferroelectric memory structures comprises a crystalline ferroelectric material portion 54 and a crystalline template material portion 52 located between a respective electrically conductive layer 46 of the electrically conductive layers and the crystalline ferroelectric material portion 54.

In one embodiment, in each of the ferroelectric memory structures (52, 54), the crystalline template material portion 52 contacts the crystalline ferroelectric material portion 54, and the crystalline template material portion 52 is laterally spaced from the vertical semiconductor channel 60 by the crystalline ferroelectric material portion 54.

In one embodiment, the crystalline ferroelectric material portion 54 contacts a respective surface segment of the vertical semiconductor channel 60, and the crystalline template material portion 52 contacts at least one of insulating layers 32.

In one embodiment, the crystalline ferroelectric material portions 54 comprise hafnium zirconium oxide. In one embodiment, the crystalline template material portions 52 comprise a material selected from germanium or strontium titanium oxide.

In one embodiment, each of the crystalline ferroelectric material portions 54 comprises a respective annular horizontally-extending groove 54G that extends outward from the vertical semiconductor channel 60 toward the electrically conductive layers 46; and the vertical semiconductor channel 60 comprises a vertical stack of ring-shaped protrusions 60P contacting a respective one of the annular horizontally-extending grooves 54G of the crystalline ferroelectric material portions 54.

In one embodiment, each of the crystalline ferroelectric material portions 54 comprises at least one inner sidewall segment that is vertically coincident with a sidewall of a respective overlying insulating layer 32 of the insulating layers 32.

In the first embodiment, each of the crystalline template material portions 52 contacts a sidewall of a respective one of the electrically conductive layers 46.

In the second embodiment, the semiconductor structure comprises backside dielectric liners 44 embedding a respective one of the electrically conductive layers 46 and laterally surrounding a respective one of the crystalline ferroelectric material portions 54, wherein each of the crystalline template material portions 52 is laterally spaced from a most proximal one of the electrically conductive layers 46 by a respective one of the backside dielectric liners 44.

In the first and second configurations, each of the crystalline template material portions 52 comprises: a respective upper annular horizontal portion contacting a bottom surface of a respective overlying insulating layer 32 within the alternating stack (32, 46); a respective lower annular horizontal portion contacting a top surface of a respective underlying insulating layer 32 within the alternating stack (32, 46); and a respective tubular vertically-extending portion adjoined to an outer periphery of the respective upper annular horizontal portion and adjoined to an outer periphery of the respective lower annular horizontal portion.

In the fourth configuration shown in FIG. 22C, each of the ferroelectric memory structures (52, 54) comprises an additional crystalline template material portion 52 that is vertically spaced from the crystalline template material portion 52 by the crystalline ferroelectric material portion 54; and the additional crystalline template material portion 52 contacts a respective additional insulating layer 32 within the alternating stack (32, 46).

In the third configuration shown in FIG. 21C, each of the crystalline template material portions 52 has a respective tubular configuration and has an inner sidewall that vertically extends continuously from the respective insulating layer 32 to a respective additional insulating layer 32 among the insulating layers 32.

In one embodiment, the semiconductor structure comprises: a semiconductor material layer 10 located underneath the alternating stack (32, 46), wherein the vertical semiconductor channel 60 contacts the semiconductor material layer 10; a source region 61 embedded within the semiconductor material layer 10; and a drain region 63 contacting an upper end of the vertical semiconductor channel 60.

The various embodiments of the present disclosure provide ferroelectric memory devices including crystalline ferroelectric material portions 54 having large crystal sizes due to being formed in contact with the crystalline template material portions 52. The crystalline template material portions 52 function as crystallization templates for growing the crystalline ferroelectric material portions 54 as crystalline structures having large grain sizes, which may be comparable to the lateral dimensions and the vertical dimensions of the crystalline ferroelectric material portions 54. The large grain size of the crystalline ferroelectric material portions 54 increases the magnitude of ferroelectric polarization within the crystalline ferroelectric material portions 54. The electrical performance and the reliability of the ferroelectric memory structures (52, 54) can be superior to comparative structures that do not employ any crystalline template material portion.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A ferroelectric memory device, comprising:
an alternating stack of insulating layers and electrically conductive layers;
a memory opening extending vertically through the alternating stack and including laterally-protruding portions at levels of the electrically conductive layers; and
a memory opening fill structure located in the memory opening and comprising a vertical semiconductor channel and a vertical stack of discrete ferroelectric memory structures located in the laterally-protruding portions of the memory opening,
wherein each of the ferroelectric memory structures comprises a crystalline ferroelectric material portion and a crystalline template material portion located between a respective electrically conductive layer of the electrically conductive layers and the crystalline ferroelectric material portion.

2. The semiconductor structure of claim 1, wherein in each of the ferroelectric memory structures, the crystalline template material portion contacts the crystalline ferroelectric material portion, and the crystalline template material portion is laterally spaced from the vertical semiconductor channel by crystalline ferroelectric material portion.

3. The semiconductor structure of claim 2, wherein:
the crystalline ferroelectric material portion contacts a respective surface segment of the vertical semiconductor channel; and
the crystalline template material portion contacts at least one of insulating layers.

4. The semiconductor structure of claim 1, wherein the crystalline ferroelectric material portions comprise hafnium zirconium oxide.

5. The semiconductor structure of claim 4, wherein the crystalline template material portions comprise germanium.

6. The semiconductor structure of claim 4, wherein the crystalline template material portions comprise strontium titanium oxide.

7. The semiconductor structure of claim 1, wherein:
each of the crystalline ferroelectric material portions comprises a respective annular horizontally-extending groove that extends outward from the vertical semiconductor channel toward the electrically conductive layers; and
the vertical semiconductor channel comprises a vertical stack of ring-shaped protrusions contacting a respective one of the annular horizontally-extending grooves of the crystalline ferroelectric material portions.

8. The semiconductor structure of claim 1, wherein each of the crystalline ferroelectric material portions comprises at least one inner sidewall segment that is vertically coincident with a sidewall of a respective overlying insulating layer of the insulating layers.

9. The semiconductor structure of claim 1, wherein each of the crystalline template material portions contacts a sidewall of a respective one of the electrically conductive layers.

10. The semiconductor structure of claim 1, further comprising backside dielectric liners embedding a respective one of the electrically conductive layers and laterally surrounding a respective one of the crystalline ferroelectric material portions, wherein each of the crystalline template material portions is laterally spaced from a most proximal one of the electrically conductive layers by a respective one of the backside dielectric liners.

11. The semiconductor structure of claim 1, wherein each of the crystalline template material portions comprises:
a respective upper annular horizontal portion contacting a bottom surface of a respective overlying insulating layer within the alternating stack;
a respective lower annular horizontal portion contacting a top surface of a respective underlying insulating layer within the alternating stack; and
a respective tubular vertically-extending portion adjoined to an outer periphery of the respective upper annular horizontal portion and adjoined to an outer periphery of the respective lower annular horizontal portion.

12. The semiconductor structure of claim 1, wherein:
each of the ferroelectric memory structures further comprises an additional crystalline template material portion that is vertically spaced from the crystalline template material portion by the crystalline ferroelectric material portion; and
the additional crystalline template material portion contacts a respective additional insulating layer within the alternating stack.

13. The semiconductor structure of claim 1, wherein each of the crystalline template material portions has a respective tubular configuration and has an inner sidewall that vertically extends continuously from the respective insulating layer to a respective additional insulating layer of the insulating layers.

14. A method of forming a ferroelectric memory device, comprising:
forming an alternating stack of insulating layers and spacer material layers over a substrate, wherein the spacer material layers are formed as electrically conductive layers or are formed as sacrificial material layers that are subsequently replaced with the electrically conductive layers;
forming a memory opening vertically extending through the alternating stack;
forming lateral recesses at levels of the spacer material layers around the memory opening by isotropically etching the spacer material layers selective to the insulating layers;
forming crystalline template material portions within the lateral recesses;
forming dielectric material portions in remaining volumes of the lateral recesses;
forming a vertical semiconductor channel vertically extending through each layer in the alternating stack within the memory opening; and
converting the dielectric material portions into crystalline ferroelectric material portions by performing an anneal process prior to or after formation of the vertical semiconductor channel.

15. The method of claim 14, further comprising:
forming a continuous crystalline template material layer on sidewalls of the insulating layers around the memory opening and on recessed sidewalls of the spacer material layers around the lateral recesses; and
etching back vertically-extending portions of the continuous crystalline template material layer from the memory openings, wherein remaining portions of the continuous crystalline template material layer comprise the crystalline template material portions.

16. The method of claim 14, wherein:
the spacer material layers are formed as the electrically conductive layers; and
each of the crystalline template material portions comprises:
- a respective upper annular horizontal portion contacting a bottom surface of a respective overlying insulating layer within the alternating stack;
- a respective lower annular horizontal portion contacting a top surface of a respective underlying insulating layer within the alternating stack; and
- a respective tubular vertically-extending portion adjoined to an outer periphery of the respective upper annular horizontal portion and adjoined to an outer periphery of the respective lower annular horizontal portion.

17. The method of claim 14, wherein:
the spacer material layers are formed as the sacrificial material layers; and
the method further comprises forming backside recesses by removing the sacrificial material layers and by forming the electrically conductive layers within volumes of the backside recesses.

18. The method of claim 17, wherein:
removing of the sacrificial material layers comprises etching the sacrificial material layers selective to the crystalline template material portions; and
each of the electrically conductive layers is formed directly on a vertically-extending sidewall of a respective one of the crystalline template material portions that vertically extends from a bottom surface of a respective overlying insulating layer to a top surface of a respective underlying insulating layer.

19. The method of claim 17, further comprising removing a vertically-extending portion of each of the crystalline template material portions after formation of the backside recesses, wherein a sidewall of a respective one the crystalline ferroelectric material portions is physically exposed to each of the backside recesses.

20. The method of claim 14, wherein:
the crystalline ferroelectric material portions comprise hafnium zirconium oxide; and
the crystalline template material portions comprise germanium or strontium titanium oxide.

* * * * *